United States Patent [19]
Storer

[11] Patent Number: 4,876,541
[45] Date of Patent: Oct. 24, 1989

[54] STEM FOR DYNAMICALLY COMPRESSING AND DECOMPRESSING ELECTRONIC DATA

[75] Inventor: James A. Storer, Lincoln, Mass.

[73] Assignee: Data Compression Corporation, Lexington, Mass.

[21] Appl. No.: 108,929

[22] Filed: Oct. 15, 1987

[51] Int. Cl.[4] .............................................. H03M 7/42
[52] U.S. Cl. ....................................... 341/51; 341/67; 341/106
[58] Field of Search ................ 340/347 DD; 358/261; 341/51, 65, 67, 69, 106

[56] References Cited

U.S. PATENT DOCUMENTS 4,464,650  8/1984  Eastman et al. .
4,558,302  12/1985  Welch .
4,612,532  9/1986  Bacon et al. ................ 340/347 DD

OTHER PUBLICATIONS

D. A. Huffman; "A Method for the Construction of Minimum–Redundancy Codes"; Proceedings of the Ire; vol. 40, pp. 1098–1101; 1952.
A Lempel et al; "On the Complexity of Finite Sequences"; IEEE Transactions of Information Theory; 22:1, pp. 75–81; 1976.
V. S. Miller et al; "Variations on a Theme by Lempel and Ziv", Combinatorial Algorithms on Words, pp. 131–140; 1985.
J. B. Seery et al; "A Universal Data Compression Algorithm Description and Preliminary Results"; Technical Memorandum; 1977.
J. B. Seery et al; "Further Results on Universal Data Compression"; Technical Memorandm; 1978.
J. A. Storer et al; "Data Compression Via Textual Substitution"; Journal of the Association for Computing Machinery; vol. 29:4; 1982.
J. A. Storer; "Textual Substitution Techniques for Data Compression"; Combinatorial Algorithms on Words; pp. 120–121; 1985.
T. A. Welch; "A Technique for High–Performance Data Compression"; IEEE Computer, vol. 17:6; 1984.

Primary Examiner—William M. Shoop, Jr.
Assistant Examiner—Marc S. Hoff
Attorney, Agent, or Firm—Schiller, Pandiscio & Kusmer

[57] ABSTRACT

A data compression system for encoding and decoding textual data, including an encoder for encoding the data and for a decoder for decoding the encoded data. Both encoder and decoder have dictionaries for storing frequently-appearing strings of characters. Each string is identified by a unique pointer. The input data stream is parsed and matched with strings in the encoder dictionary using a novel matching algorithm. The pointer associated with the matched string is then transmitted to a remote location for storage or decoding. Thereafter, using a novel update algorithm the encoder dictionary is updated to include new strings of data based on the matched string of data. If required, a novel deletion algorithm is employed to remove infrequently used strings of data to provide room for the newly generated strings of data. The strings of data may be arranged using a modified least recently used queue.

The decoder matches each unique pointer in the stream of compressed input data with a corresponding pointer in the decoder dictionary. The decoder then transmits the string of character data associated with the matched pointer, thereby providing textual data in original, uncompressed form. Thereafter, using the novel update and deletion algorithms, new strings of data are added to, and old strings of data are deleted from, the decoder dictionary, so as to ensure both encoder and decoder dictionaries contain identical strings of data.

55 Claims, 8 Drawing Sheets

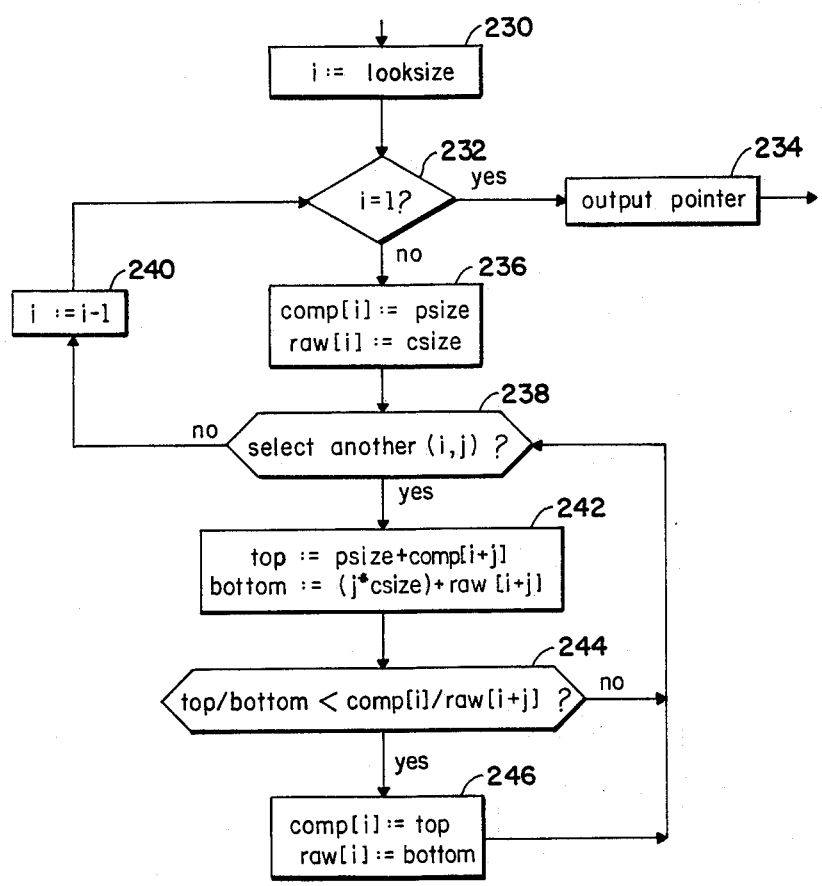
Fig. 5
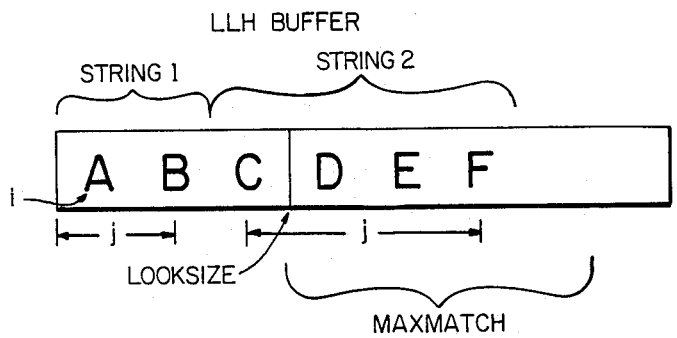
Fig. 6
ab bbbab
Fig. 7

|    | MATCH | STRINGS ADDED |
|----|-------|---------------|
| 1  | T     |               |
| 2  | H     | TH            |
| 3  | E     | HE            |
| 4  | _     | E_            |
| 5  | C     | _C            |
| 6  | A     | CA            |
| 7  | T     | AT            |
| 8  | _     | T_            |
| 9  | AT    | _A _AT        |
| 10 | _     | AT_           |
| 11 | TH    | _T _TH        |
| 12 | E_    | THE THE_      |
| 13 | CA    | E_C E_CA      |
| 14 | R     | CAR           |
| 15 | _AT   | R_A R_AT      |
| 16 | E_    | _ATE _ATE_    |
| 17 | THE_  | E_T E_TH E_THE E_THE_ |
| 18 | R     | THE_R         |
| 19 | AT    | RAT           |

Fig. 8

| MATCH | LRU QUEUE |
|-------|-----------|
| 1 T   |           |
| 2 H   | TH        |
| 3 E   | TH HE     |
| 4 _   | TH HE E_  |
| 5 C   | TH HE E_ _C |
| 6 A   | TH HE E_ _C CA |
| 7 T   | TH HE E_ _C CA AT |
| 8 _   | TH HE E_ _C CA AT T_ |
| 9 AT  | TH HE E_ _C CA T_ AT _AT _A |
| 10 _  | TH HE E_ _C CA T_ AT_ AT _AT _A |
| 11 TH | HE E_ _C CA T_ AT_ AT _AT _A TH _TH _T |
| 12 E_ | HE _C CA T_ AT_ AT _AT _A THE_ THE TH _TH _T E_ |
| 13 CA | HE _C T_ AT_ AT _AT _A THE_ THE TH _TH _T E_CA E_C E_ CA |
| 14 R  | _C T_ AT_ AT _AT _A THE_ THE TH _TH _T E_CA E_C E_ CAR CA |
| 15 _AT | AT THE_ THE TH _TH _T E_CA E_C E_ CAR CA _AT _A R_AT R_A R_ |
| 16 E_ | THE TH _TH _T E_CA E_C CAR CA _ATE_ _ATE _AT _A R_AT R_A R_ E_ |
| 17 THE | E_C CAR CA _ATE_ _ATE _AT _A R_AT R_A R_ E_THE E_TH E_T E_ THE TH |
| 18 _  | CAR CA _ATE_ _ATE _AT _A R_AT R_A R_ E_THE E_TH E_T E_ THE_ THE TH |
| 19 R  | CA _ATE_ _ATE _AT _A R_AT R_A R_ E_THE E_TH E_T E_ THE_ THE TH _R |
| 20 A  | _ATE_ _ATE _AT _A R_AT R_A R_ E_THE E_TH E_T E_ THE_ THE TH _R RA |
| 21 T  | _ATE _AT _A R_AT R_A R_ E_THE E_TH E_T E_ THE_ THE TH _R RA AT |

Fig. 9

STEM FOR DYNAMICALLY COMPRESSING AND DECOMPRESSING ELECTRONIC DATA

The present invention pertains to systems for encoding and decoding electronic data, and more particularly to systems for providing on-line, loss less compression and decompression of character data.

Practical data compression methods have been known for several decades. For instance, an early method of compressing data was described by D. Huffman in the article "A Method for the Construction of Minimum-Redundancy Codes", published in *Proceedings of the IRE*, vol. 40, pages 1098–1101, 1952. Traditional off-line data compression methods typically involve (1) scanning the data to gather statistical information about the nature of the data and (2) compressing the data based upon the statistical information gained during the scanning step. In traditional on-line data compression methods, a single pass is made over the data and compression is effected based on information obtained during this single pass. If, in performing this single pass, compression is based only on some fixed information, then the method is said to be static. If, on the other hand, compression is based on information, gathered about the data from the data input stream which has already been compressed, the compression is said to be dynamic or adaptive.

A theoretical background for lossless, dynamic, on-line compression of textual material was developed by A. Lempel and J. Ziv, and is described i their article "On Complexity of Finite Sequences", *IEEE Transactions on Information Theory*, 22:1(1976), 75–81. J. B. Seery and J. Ziv experimented with practical implementations of the data compression techniques developed by Lempel and Ziv. The results of the experiments by Seery and Ziv were disclosed in the articles "A Universal Data Compression Algorithm: Description and Preliminary Results", *Technical Memorandum*, Bell Laboratories, Murray Hill, N.J., 1977, and "Further Results on Universal Data Compression", *Technical Memorandum*, Bell Laboratories, Murray Hill, N.J., 1978.

The textual data compression techniques of Lempel, Ziv and Seery involve storing frequently-appearing strings of characters in memory. A pointer to the stored string of characters is transmitted in place of the full string when a new string of characters appears in the input stream that matches the stored string of characters. When a string of characters appears in the input stream that matches a stored string of characters, but also includes a string of one or more new characters, the pointer for the matched string is transmitted along with the first character of the new string of characters, with the first character being transmitted in uncompressed form.

Although the data compression techniques of Lempel and Ziv have provably good information theoretic properties, the techniques typically require undesirably large amounts of computer memory and time. On the other hand, while the data compression techniques of Seery and Ziv require only a limited amount of memory, the power of the technique is limited inasmuch as once the memory of the data system used is full, no additional strings of characters can be added. As such, the Seery and Ziv technique does not provide optimal compression for frequently-changing arrangements of characters after the memory of the data system used is full. The data compression techniques of Lempel, Ziv and Seery have been implemented in data compression systems of the type disclosed in U.S. Pat. No. 4,464,650 to Eastman et al.

T. A. Welch developed data compression techniques that are similar to those of Seery and Ziv. The Welch compression techniques are described in the article "A Technique for High-Performance Data Compression", *IEEE Computer*, vol. 17:6, p. 8–19, 1984, and in U.S. Pat. No. 4,558,302 to Welch. The Welch compression techniques suffer from the same drawbacks as the Seery and Ziv techniques. Specifically, in the Welch techniques the first character of the new string of characters is transmitted in uncompressed form along with the matched string, with the result that less than optimal compression is achieved. Also, once the memory of the data system used is full, no new strings of data can be added, with the result that less than optimal compression is achievable when the arrangement of characters in the data input stream frequently changes.

J. A. Storer and T. G. Szymanski developed an off-line data compression technique that involved transmitting an index identifying a stored string of data in place of an identical string of data received in the data input stream. The Storer and Szymanski technique differs from the technique of Lempel and Ziv in that the former technique is off-line and is more concerned with the maintenance of dictionaries of stored strings including pointers identifying the strings, while the latter technique is on-line and is oriented more toward the information theoretic properties of data compression. The Storer and Szymanski technique is described in the article "Data Compression via Textual substitution", *Journal of the Association for Computing Machinery*, vol. 29, No. 4, p. 928–951, 1982.

V. S. Miller and M. N. Wegman developed another first-character growing strategy data compression technique. The Miller/Wegman technique uses a least recently used queue for arranging stored strings of data for storage in memory in accordance with an identity ("ID") strategy. This ID strategy involves concatenating the entire current match with the entire previous or last match. The Miller/Wegman technique is described in the article "Variations on a theme by Lempel and Ziv", *Combinatorial Algorithms on Words*, Springer-Verlag (A. Apostolico and Z. Galil, editors), Berlin, p. 131–140, 1985.

J. A. Storer developed a practical technique for compressing data loosely based on the data compression technique theories disclosed by Lempel and Ziv and Storer and Szymanski. The Storer technique is disclosed in the article "Textual Substition Techniques for Data Compression", *Combinational Algorithms on Words* (edited by A. Apostolico and Z. Galil), Springer-Verlag, Berlin, p. 120–121, 1985.

In this known Storer technique, an encoder and decoder are provided, each having a fixed, finite amount of memory. This memory, also referred to as a "dictionary", is adapted to contain a finite number of entries. Each entry has a unique pointer associated therewith. The dictionaries at the encoder and decoder may be initialized at the beginning of time to contain identical information. The encoder then repeats forever the following steps:

(1) find the longest string of characters in the input stream that matches an entry in the encoder dictionary;

(2) transmit the pointer associated with the entry with which the match is made; and (3) update the dictionary;
(a) if the dictionary is full then delete one of its entries;
(b) add the current match.

Similarly, the decoder repeats forever the following steps:
(1) receive the pointer transmitted by the encoder and look up in the decoder dictionary the entry associated with the pointer;
(2) output the entry associated with the pointer; and
(3) update the dictionary
(a) if the dictionary is full then delete one of its entries;
(b) add the current match.

The first step performed by the encoder amounts to a greedy algorithm for parsing the input stream. Storer indicates that better worst-case performance may be achieved by incorporating a limited amount of look-ahead in the first step performed by the encoder.

Yet another system for dynamically compressing data is disclosed in U.S. Pat. No. 4,612,532 to Bacon et al. The compression system of Bacon et al does not rely on the compression theories developed by Lempel and Ziv. Instead, in the Bacon et al system a dynamically changing table is maintained based on conditional probabilities. Input data is compressed and decompressed in accordance with information provided from the table.

A primary object of the present invention is to provide lossless textual data compression at relatively high rates of compression in real time for data provided over commercial serial data sources such as modems.

Another object of the present invention is to provide a system for compressing textual data without losses according to novel algorithms for parsing and matching input data strings with strings in the dictionary of the system, including an algorithm for improving parsing of the input data stream by looking ahead at a limited amount of the data input stream.

Yet another object of the present invention is to provide a system for compressing textual data without losses according to learning algorithms for generating new strings to be added to the dictionary of the system that are distinct from, and novel relative to, the first character growing strategies of Lempel, Ziv, Seery and Welch and the ID growing strategy of Miller and Wegman.

Still another object of the present invention is to provide a system for compressing textual data without losses according to novel algorithms for arranging and deleting strings of data from the dictionary of the system, including the option of selectively "freezing" a set of strings in the dictionary.

Yet another object of the present invention is to provide a system for compressing textual data in which rates of data compression are maximized by dynamically varying the size the system's dictionaries.

These and other objects of the present invention are achieved by a data compression system comprising a data compression module having an encoder for compressing and transmitting compressed textual data and a decoder for receiving and decompressing the compressed textual data in accordance with novel learning algorithms. Both the encoder and decoder comprise a dictionary in which a plurality of frequently-appearing strings of characters are stored. Each string is identified by a unique pointer. The encoder receives and matches strings of input data with strings of characters stored in the encoder dictionary. The pointer for the stored string with which a match is made is then transmitted. This matching is effected using a conventional greedy algorithm, or alternatively, a novel limited-look ahead algorithm. The system is designed so that matches at least one character long can always be made with ones of the stored strings. As a result, a pointer is always transmitted after a match has been made, even if the match is one character long. This contrasts with the compression techniques of Seery, Ziv and Welch where matches cannot always be made, and therefore single characters are often transmitted in uncompressed form.

The update learning algorithm adds N new strings of characters to the encoder and decoder dictionaries, where N equals the number of characters in the newly matched string of data characters Y received from the input data stream. The learning algorithm creates the first new string of characters by adding to the string of characters in the dictionary last or previously matched with a string of input data the first character in the string of characters Y. The second new string of characters includes the last-matched string of characters plus the first two characters in the new string of characters Y. Successive new strings are similarly created until N new strings of characters have been created, with the last new string of characters consisting of the last-matched string of characters and the entire new string of characters Y. A modified version of this update learning algorithm is also disclosed herein, wherein the number of strings that can depend from a single non-root node of the dictionary is limited.

The invention includes a deletion algorithm for arranging the dictionary strings in a modified least recently used queue, in accordance with a special reverse positioning procedure. Using this procedure, the most frequently used strings are positioned near the front of the queue and the least frequently used strings are positioned near the end of the queue.

The deletion algorithm deletes from the encoder dictionary the approximately least recently used strings of characters to provide room for newly generated strings of characters. The deletion algorithm is designed to never delete the basic character set with which the encoder and decoder dictionaries are initialized and may be designed to never delete other characters or strings of characters.

In one embodiment of the invention, both encoder and decoder comprise several dictionaries of varying lengths of memory. The dictionaries are operated in parallel with one another and the rates of compression achieved by the dictionaries are monitored. The dictionary achieving the best rate of compression is used so long as it out performs the other dictionaries.

The present invention is a data compression system for compressing and decompressing a stream or sequence of digital data character signals. The system comprises an encoder for compressing the input data signals, and a decoder for decompressing the compressed data signals. Both encoder and decoder have a read-write memory for storing a "dictionary" or string table of frequently-appearing strings of characters. Each string is identified by a unique pointer or code.

Compression is effected by parsing the data input stream into strings of data characters and then matching each of the parsed strings with a string in the encoder dictionary. The pointer associated with each matched string is transmitted in place of the string.

Decompression is effected by matching each pointer transmitted by the encoder with a corresponding pointer in the decoder's dictionary. The string in the decoder's dictionary associated with the matched pointer is then transmitted, completing the decompression process.

After each match is made, both the encoder and decoder dictionaries are updated to include new or repositioned strings of data based on the data entering the dictionary. This updating is affected such that the dictionaries of the encoder and decoder contain identical strings.

The present invention may be advantageously employed in both the transmission and storage of electronic data.

BRIEF DESCRIPTION OF THE DRAWING

FIG. 5 is a flow diagram of the limited lookahead heuristic (LLH);

FIG. 6 shows the LLH buffer;

FIG. 7 is an example of an input stream;

FIG. 8 illustrates the manner in which new strings of data are generated using the pure all-prefixes heuristic (PAPH);

FIG. 9 illustrated the manner in which strings of data are positioned and deleted using the modified least-recently-used heuristic (MLRUH);

Referring to FIG. 1, the present invention comprises one or more data compression modules 20. Each module 20 performs both data compression and data decompression. Thus, for data storage only a single data compression module is required. For data transmission between two separate stations, a data compression module 20 must be provided at both the transmitting station and the receiving station. As a conceptual tool, compression will be described as occurring at an encoder and decompression will be described as occurring at a decoder. In practical implementation, the encoder and decoder are contained in a single data compression module 20.

Figures 1, 2:
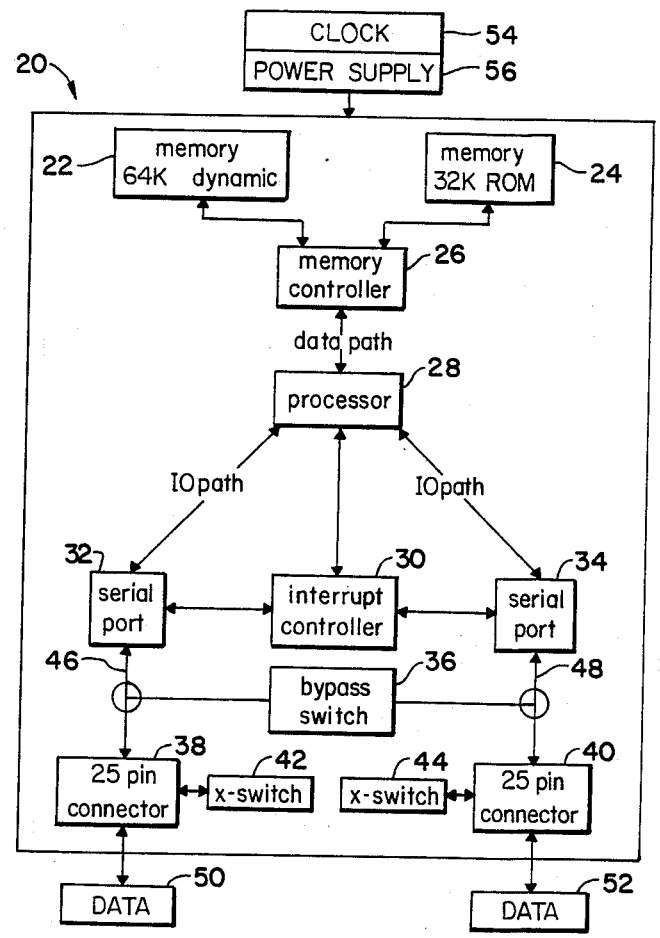
FIG. 1 is a block diagram of the preferred embodiment of the present invention.
FIG. 2 is an example of the contents of the string table or dictionary maintained in memory 22.

Data compression module 20 comprises dynamic memory 22, read-only memory 24, memory controller 26 and microprocessor 28. Dynamic memory 22 is preferably a 64KB CMOS static RAM and is satisfactorily implemented using F1600 AM chips. Read-only memory 24 is preferably a 32KB CMOS-masked ROM. Memory 24 may be satisfactorily implemented using an LH23257 chip. Memory controller 26 is a DMA controller that may be satisfactorily implemented using an 82C37 chip. Microprocessor 28 is preferably a 16-bit micro with a 3.9 mHz clock. The microprocessor may be satisfactorily implemented using an 8088C chip.

Dynamic memory 22 is connected to memory controller 26 so that two-way data communication may be achieved therebetween. Read-only memory 24 is connected to memory controller 26 so that two-way data communication may be achieved therebetween. Memory controller 26 is connected to microprocessor 28 so that two-way data communication may be achieved therebetween.

Dynamic memory 22 is provided for holding input data, dictionary data, and other data used by microprocessor 28 for compressing and decompressing input data. Read-only memory 24 is provided for storing the firmware used by microprocessor 28 for compressing and decompressing input data. Memory controller 26 is provided for controlling communication between microprocessor 28 and dynamic memory 22 and microprocessor 28 and read only memory 24.

Data compression module 20 also comprises interrupt controller 30, serial input/output port 32, serial input/output port 34, by-pass switch 36, pin connector 38, pin connector 40, X-switch 42 and X-switch 44. Interrupt controller 30 may be satisfactorily implemented using a 82C59 chip. Serial input/output ports 32 and 34 may be satisfactorily implemented using 82C51A or 8250 ports. Bypass switch 34 is conventional a two-way 6-pole switch. Pin connectors 38 and 40 are also conventional male 25 pin data communication connectors.

Microprocessor 28 is connected to interrupt controller 30 so that two-way data communication may be achieved therebetween. Preferably, an 8-bit wide data bus is used to couple microprocessor 28 with interrupt controller 30. Alternatively, to increase the rate of data transmission (at an increased hardware cost), a 16-bit wide data bus may be employed. Serial input/output port 32 is connected to interrupt controller 30 so that two-way data communication may be achieved therebetween. Serial input/output port 34 is connected to interrupt controller 30 so that two-way data communication may be achieved therebetween. Preferably, an 8-bit wide data bus is used to couple interrupt controller 30 with I/O ports 32 and 34. Alternatively, as discussed above, a 16-bit wide data bus may be employed for coupling the controller 30 with I/O ports 32 and 34.

Serial input/output port 32 is connected by bus 46 to pin connector 38 so that two-way data communication may be achieved between port 32 and connector 38. The latter is adapted for attachment to a "host" or data device 50, such as a source of serial binary-encoded data, e.g. a microcomputer, or a terminal. Serial input/output port 34 is connected by bus 48 to pin connector 40 so that two-way data communication may be achieved between port 34 and connector 40. The latter is adapted for attachment to a communication link or data device 52, e.g. a modem or a secondary storage source.

X-switch 42 is connected to the data input and data output pins of pin connector 38. X-switch 44 is connected to the data input and data output pins of pin connector 40.

Bypass switch 36 is connected to both bus 46 and bus 48.

Interrupt controller 30 is provided for alternately coupling serial ports 32 and 34 with microprocessor 28. Bypass switch 36 is provided to allow a user of data compression module 20 to disable the module so that data will pass uncompressed through the module. It may be desirable to pass data uncompressed through module 20 when such data is to be transmitted to a source other than another data compression module 20 and the user does not choose to disconnect the data device 50 from the data compression module. For instance, when a first data compression module 20 is used to communicate data to both a second data compression module and a second receiver not having a data compression module 20, the user will close bypass switch 36, thereby disabling the compression operation of the first data compression module, whenever it is desired to transmit data in uncompressed form to the second receiver.

Because the data-in and data-out pins of serial input-/output port 32 are often reversed with respect to the corresponding pins on the output cable of data device 50, X-switch 42 is provided to ensure proper connection is achieved. By changing the operating state of X-switch 42, the data-in pin on connector 38 may be connected to the data-out pin of the output cable, or vice versa, as the pin-arrangement scheme of the data device requires. Clearly, a similar connection to serial input-/output port 32 may be made with other types of data devices 50.

As with X-switch 42, the operating state of X-switch 44 may be changed, if required, so that the data-in and data-out pins of data device 52 are correspondingly respectively connected to the data-in and data-out pins of serial input/output port 34.

Clock 54 is connected to data compression module 20 in known manner to control the timing of the various components of the module, as is well known in the art. Clock 54 may be implemented using any suitable semiconductor clock chip.

Power supply 56 is connected to clock 54 and data compression module 20 in known manner to power the clock and the module. Power supply 56 is a conventional d.c. power supply.

The operation of data compression module 20 is controlled by instructions sent via data device 50 prior to or during the transmission of input data from device 50. For instance, encode and decode signals may be provided to module 20 via data device 50 to instruct the module to compress or decompress the input data it receives, as described hereinafter. Similarly, data characters may be added to the module's dictionaries for storage therein, as described hereinafter, using data device 50. Thus, operation of module 20 may be effected from a remote location, so long as data device 50 is connected thereto.

For data compression module 20 to function properly, data device 50 must be capable of receiving and responding to an xon/xoff protocol. This protocol is used to disable the transmission of characters from device 50, as when the device transmits characters at a faster band rated than data compression module 20 can accommodate. When module 20 cannot accept characters at the rate transmitted by device 50, the module 20 sends an xoff signal (typically ctrl/s, if ASCII characters are being used) that when received causes the data device to terminate the transmission of characters. Module 20 transmits an xon signal (typically ctrl/q, if ASCII characters are used) when the module is ready to receive characters, so as to instruct data device 50 to begin transmitting characters.

Data compression module 20 transmits the xon/xoff protocol in accordance with instructions stored in read-only memory 24. Using these instructions and dynamic memory 22, microprocessor 28 transmits the xon or xoff protocol signals to data device 50, as required.

Data compression module 20 has four modes of operation: a bypass mode, an encode mode, a decode mode and a simultaneous encode/decode mode. Module 20 is placed in the bypass, encode, decode or encode/decode modes by transmitting a bypass, encode, decode or encode/decode signal, respectively, from the data device 50 at the beginning of transmission of the character data. Upon receipt of a bypass signal, read-only memory 24 instructs module 20 to pass input data through in uncompressed form. Upon receipt of the encode signal, read-only memory 24 accesses a data compression algorithm stored therein that is used, as described hereinafter, by module 20 to compress input character data. Similarly, upon receipt of the decode signal, memory 24 accesses a data decompression algorithm stored therein that is used, as described hereinafter, by module 20 to decompress compressed input character data. Likewise, when an encode/decode signal is received, memory 24 simultaneously accesses the data compression and data decompression algorithms stored in the memory so as to simultaneously compress input character data and decompress compressed input character data.

In addition, module 20 may be placed in the bypass mode by closing switch 36, as noted above. Bypass switch 36 is provided to allow input data to be passed through in uncompressed form when it is not desired to place module 20 in the bypass module using instructions transmitted from data device 50, e.g. when module 20 does not respond to such instructions due to malfunction of the module.

MEMORY STRUCTURE

Referring to FIG. 2, data compression and decompression is performed in data compression module 20 using a string table or dictionary 100 that is maintained in dynamic memory 22. The dictionary comprises a plurality of strings 102. Each string 102 comprises a collection of data character signals that represent one or more numbers or textual characters. The present invention is adapted, to perform lossless compression with any data character format code.

Theoretically, dictionary 100 may comprise an infinite number of strings 102. It has been determined, however, that satisfactory compression is achievable with data compression module 20 when the number of strings 102 provided in dictionary 100 ranges from between $2^{12}$ (4096) to $2^{16}$ (65,536) strings. Preferably, dictionary 100 comprises $2^{12}$ strings 102. Dictionaries having lesser or greater numbers of strings, however, may also be satisfactorily employed.

An initial character set is stored in dictionary 100 comprising each character of the format code used, as well as other combinations of characters. Preferably, this initial character set has 256 elements, although character sets having a greater or lesser number of elements may also be satisfactorily employed. Thus, for instance, an initial character set having 256 elements might include the 128 characters of a known format code, as well as other frequently-appearing characters or combinations of characters. Each element of the initial character set constitutes a string 102. The strings that together contain the initial character set are permanently stored or "frozen" in the dictionary. As noted below, other strings of characters may also be frozen in the dictionary.

Each string is uniquely identified by an address or pointer 104 having a length of X bits, where X equals the log exponent defining the dictionary size. For instance, in a dictionary having $2^{12}$ strings, each pointer 104 is defined by a 12 bit code.

Figure 3:
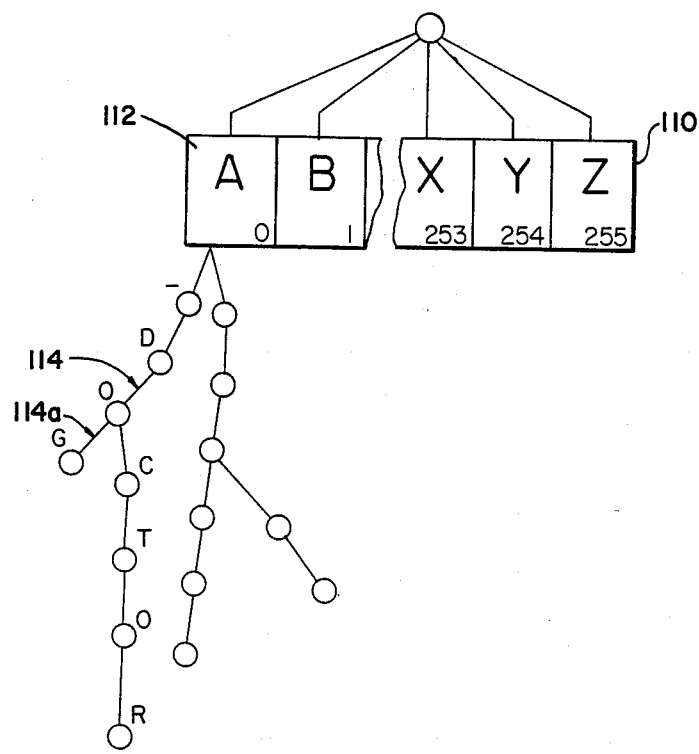
FIG. 3 shows the modified trie organization of the data contained in the dictionary.

The data organization structure of dictionary 100 illustrated in FIG. 2 is schematic in nature. Preferably, the data structure of dictionary 100 is based on a modified trie organization. Referring to FIGS. 2 and 3, in this modified trie organization the characters of the initial character set are stored as an array 110. Each character in array 110 constitutes a root node 112 and is assigned a unique address. A chain of descendant nodes 114 may depend from each root node 112. Each chain of descendant nodes 114 consists of one or more characters, or more precisely, the address(es) of one or more characters. For instance, if the left-most node of array 110 contains the character A (actually the address of character A) and a chain of descendant nodes 114a depending therefrom contains the characters _DOG (actually the addresses of the letters _DOG), a string 102 is created containing the words A DOG. The last entry in the string is identified as a leaf.

Theoretically, the number of descendant nodes 114 that may depend from a root node 112 is limited only by the size of dictionary 100. In an embodiment of the present invention, the number of descendant nodes 114 that may depend from a single descendant node 114 is limited in number to some percentage of the total number of root nodes 112 or characters in array 110. Preferably, this percentage is equal to about 5 to 10 percent of the total number of root nodes 112 in array 110, although other percentages may also provide satisfactory compression. For instance, in a dictionary 100 having an array 110 with 256 nodes, 12 descendant nodes 114 may be allowed to depend from each descendant node in the chain of descendants nodes depending from root node 112. When the number of descendant nodes 114 depending from a given descendant node is so limited, compression is typically improved, dictionary 100 may be represented in dynamic memory 22 in a relatively compact form, and a guaranteed worst-case access time per node is established.

The lengths of strings 102, i.e. the root node 112 plus the number of descendant nodes 114 in given chains of descendants depending therefrom, is limited only by the size of dynamic memory 22. As the address of one character in the string points to the address of the next character in the string, and so on, so as to make up an entire string, it is substantially meaningless in the present invention, to monitor or record the length of strings 102. Relatedly, the amount of memory needed for dictionary 100 depends on the number of strings stored (e.g., $2^{12}$ strings), not the length of the individual strings.

Although dictionary 100 has been described as containing array 110 which includes an initial character set with one or more strings of descendants depending therefrom, dictionary 100 may be also defined by other data structures. For instance, a hashing data structure may be used in place of a trie data structure.

As discussed briefly above, input data signals are matched with strings 102 in dictionary 100 maintained in dynamic memory 22. The pointer 104 associated with each matched string is then transmitted as data output. New strings are continually grown in dictionary 100 and least or nearly least recently used strings are continually deleted from the dictionary in accordance with a modified least recently used procedure described hereinafter. These various operations are performed in microprocessor 28 using (1) data signals stored as strings in dynamic memory 22 and (2) various algorithms stored in read-only memory 24. Memory controller 26 is provided for controlling the sequence in which (1) data is entered and removed from dynamic memory 22 and (2) information is removed from read-only memory 24. Interrupt controller 30 is provided for controlling the sequence in which data is input into and output from microprocessor 28, as is well known in the art.

Data Compression

Data compression module 20 compresses input character data provided thereto from data device 50 using a data compression algorithm stored in read only memory 24. This compression algorithm operates in accordance with the various steps of the flow diagram illustrated in FIG. 4. As described hereinafter, the compression algorithm performs data compression using several sub-routine algorithms. The compression algorithm and its sub-routine algorithms will be described using the block flow diagrams illustrated in FIGS. 4, 5, and 13 and using the examples illustrated in FIGS. 6-9, 11 and 12. Line by line coding of the algorithms is considered to be well within the skill of an ordinary practitioner and is not, therefore, provided herein.

Because data compression module 20 may also be operated to decompress character data, as described hereinafter, module 20 must be notified to process data using the compression algorithm before any character data is processed therein. Typically, such notification occurs in the form of a code transmitted at the beginning of the stream of character data to be compressed. When microprocessor 28 receives this code, it calls up the compression algorithm stored in read-only memory 24 and then processes input data using the compression algorithm.

As the first step of the compression algorithm, step 200, dictionary 100 is initialized with all characters of the selected underlying alphabet. For instance, if 8 bit long characters are used, as is preferred, 256 root nodes 112 are defined and are initialized with an underlying alphabet consisting of 256 characters. Similarly, if a format code using 7-bit long characters is employed (e.g., ASCII), 128 root nodes 112 are defined and are initialized with a 128 character alphabet.

The initial character set may be entered in read-only memory 24 using data device 50. When read-only memory 24 is implemented using an LH23257 chip, sufficient extra memory is provided to allow a user to plug in a ROM chip to memory 24 containing a customized initial dictionary.

Next, at step 202, the input data stream is parsed using a subroutine algorithm referred to herein as the match heuristic ("MH") so as to obtain a character string that matches a string 102 in dictionary 100. Then, the pointer 104 associated with the matched string is transmitted as output. The match heuristic will be described in greater detail below.

At step 204, a subroutine algorithm referred to as the update heuristic ("UH") is employed for generating a set of new strings X comprising at least one string x. Set X is based, in part, on the characters contained in the current match string t. Set of strings X is used to update dictionary 100, as described below in the description of the update algorithm.

Several questions are posed at step 206, the answers to which will determine which path the algorithm follows. If the set of strings X is empty or if dictionary 100 is full and the string positioned for deletion from dictionary 100 cannot be deleted from the dictionary, the compression algorithm returns to step 202. Set X will be empty, for instance, when dictionary 100 has been updated to include all the strings x in set X. Dictionary 100 will be full and the string positioned for deletion will not be deletable when, for instance, the last string matched consumes the entire memory capacity of dictionary 100. The manner in which strings are positioned for deletion from the dictionary is described below in the description of the subroutine algorithm referred to as the deletion heuristic ("DH"). In the event either of the queries presented in the alternative in step 206 are answered in the negative, the compression algorithm proceeds to step 208.

At step 208, a string x is removed from the set of strings X.

Next, a determination is made as to whether or not string x is in dictionary 100, as illustrated by step 210. If string x is found to be in dictionary 100, the algorithm returns to step 206 and removes another string x from the set of strings X. If string X is not in dictionary 100, the compression algorithm continues to step 212.

At step 212, a determination is made as to whether or not dictionary 100 is full. If the dictionary is not full, string x is added to the dictionary as a new string 102, as illustrated by step 214. If the dictionary is full, the compression algorithm proceeds to step 216.

Thereafter, at step 216, a subroutine algorithm referred to as the deletion heuristic ("DH") is employed to arrange the new strings generated by the update heuristic and to delete the least recently used string 102 from dictionary 100 to provide space for string x to be added to the dictionary. Then, the compression algorithm advances to step 214 where string x is added to the dictionary.

After string x has been added to dictionary 100, the compression algorithm returns to step 206 and reads in a new string x from the set of strings X. This iteration comprising steps 206–216, inclusive, continues until all the strings x have been removed from the set of strings X, at which point set X is empty. As described above, when set X is empty, the compression algorithm returns to step 202 where a new string is parsed from the input data stream and matched with a string 102 in dictionary 100.

The foregoing description of the compression algorithm provides an overview of the manner in which data compression module 20 compresses input data. The match heuristic, update heuristic, and deletion heuristic referred to briefly above will now be described in detail.

Match Heuristic

Turning now to FIGS. 2 and 5, the match algorithm parses and matches strings from the data input stream with strings 102 in dictionary using a greedy algorithm. To improve the performance of the greedy algorithm, a limited lookahead heuristic is employed in one embodiment of the invention.

The match algorithm is stored in read-out memory 24 and performs parsing and matching of data stored in dynamic memory 22. The various functions performed by the match algorithm are executed in microprocessor 28.

The match algorithm parses and matches a string t from the input data stream using a conventional greedy algorithm, e.g. a greedy algorithm of the type disclosed in U.S. Pat. No. 4,558,302 to Welch. Using the greedy algorithm, the input data stream is parsed so as to remove the longest string t possible that will match a string 102 in dictionary 100. This string t is referred to as the "current match". For instance, if the input data stream contains the characters "THE CAT", and dictionary 100 contains only the 26 characters of the alphabet, string t will contain only the character "T". Next, the pointer 104 associated with the string 102 to which the current match has been made is transmitted as output. Clearly, in a dictionary 100 having more than $2^7$ strings, no compression is achieved by transmitting the pointer to the string with which the current match has been made when the string t contains only one character and the input data is coded using the 7-bit code format. Thus, in the preferred embodiment, where dictionary 100 preferably has $2^{12}$ strings, no compression is achieved by transmitting the 12 bit pointer for the matched string in place of the current match string t, when string t consists of a single character. As described in detail below, however, significant compression is typically achievable when string t consists of two or more characters. Of course, when dictionary 100 is initially filling up with strings 102, pointers 104 will be shorter than 12 bits because less than $2^{12}$ strings will be stored in the dictionary.

When the input data stream comprises certain arrangements of characters and dictionary 100 contains certain strings, the greedy algorithm will not produce optimal parsing of the data input stream, i.e., the input data stream will be parsed into more than the minimal number of strings t required to represent the input data. For instance, if dictionary 100 (1) contains an initial set including the characters a and b, (2) is capable of holding only $2^1$ strings comprising more than one character, (3) the dictionary currently contains the strings ab and bbbb, and (4) the input data stream contains the character string abbbbab, less than optimal parsing will be achieved using the greedy algorithm. In this example, the first current match will be ab, the second current match b, the third current match b, the fourth current match b, and the fifth current match ab. Thus, the greedy algorithm will parse the input character stream into five phrases. Under an optimal parsing only three phrases are required: the first current match is a, the second current match is bbbb, and the third current match is ab.

In practice, the greedy algorithm provides satisfactory parsing of the data input stream. To achieve optimal parsing, however, one embodiment of the MH employs a limited lookahead heuristic.

The limited lookahead heuristic ("LLH") looks ahead at a portion of the incoming data stream and calculates the best parsing obtainable. Once the best parsing is found, the first string in this parsing is taken as the current match t. A limited lookahead heuristic improves parsing significantly while avoiding the need to look arbitrarily far into the input data stream, as is required for optimal parsing, and thereby losing the advantages of real time data compression.

The LLH employs a buffer for storing the incoming characters of the data input stream. This buffer is maintained in dynamic memory 22. So long as the size of the buffer is constant, the compression achieved in the present invention may properly be defined as dynamic. In practice, near optimal parses have been obtained using relatively small buffers, e.g., buffers containing 8 characters or less.

The flow diagram illustrated in FIG. 5 describes the steps followed in the LLH in providing optimal parsing of the data input stream. Line by line coding of the LLH is considered to be well within the abilities of one skilled in the art and so is not described herein.

Turning now to FIGS. 5 and 6, in the LLH flow diagram illustrated in FIG. 5, i refers to a character position inside the LLH buffer. For instance, in FIG. 6, if character B is located in the i position, then i=2.

The symbol j refers to the number of positions a data string beginning at position i extends. For example, in FIG. 6, string 2 begins at i=3 and contains 4 characters so j=4.

The term "looksize", as used herein, refers to the number of input characters that will be examined in an attempt to optimize the parsing of the input data stream. Preferably, looksize ranges between 2 and 100 with optimal rates of compression being achieved when looksize is equal to about 8.

The notation (i, j) refers to the string beginning at position i and having a length of j. For instance, in FIG. 6, if string 1 is considered to be string (i,j), then i=1 and j=2.

The LLH buffer is larger than looksize so as to accommodate a string beginning within, but extending beyond, looksize into the remainder of the LLH buffer. For instance, in FIG. 6, looksize=3, with the result that only characters A, B, and C are positioned within looksize.

The LLH buffer is large enough to accommodate string 2 which begins within, and extends beyond, looksize. A string will be permitted to extend only "maxmatch" positions beyond looksize. Preferably, maxmatch ranges from 1 to the total number of positions in the LLH buffer minus looksize, i.e. 1 to about 1000, with optimum results being achieved when maxmatch is equal to about 25.

The term csize refers to the number of bits per input character, and the term psize refers to the number of bits per pointer. The terms comp(i) and raw(i), as defined in the LLH algorithm, are equal to psize and csize, respectively. The latter terms have a value of 0 when i is positioned in the LLH buffer beyond (to the right of) looksize. For instance, in FIG. 6, if character E was in the i position, comp(i) and raw(i) would have values of 0, as looksize=3. The term comp(i+j) refers to the number of bits in the pointer(s) required to represent in compressed form the buffer for which compression ratios have already been calculated. Raw (i+j) refers to the number of bits required to represent in uncompressed form the data identified by the pointers having a length comp(i+j). Comp(i+j) and raw(i+j) are redefined with each iteration of the lower loop of the LLH algorithm, as discussed hereinafter.

Describing now the operation of the LLH algorithm illustrated in FIG. 5, at the first step, step 230, i is set equal to looksize. At step 232, a determination is made as to whether or not i=1. If it is determined to be equal to 1, then the pointer for the first string (i,j) in the group of strings parsed by the LLH is transmitted, as illustrated by step 234 and as described in greater detail below. In practice i will not equal 1 during the first iteration of the LLH algorithm. If i is determined to not be equal to 1, the algorithm proceeds to step 236.

At step 236, comp(i) is set equal to the number of bits in the pointer(s) associated with the string(s) of characters starting at position i, and extending to looksize or past looksize if the last string in the buffer starts inside but extends beyond looksize. Correspondingly, raw(i) is set equal to the number of bits required to represent in uncompressed form the data in the same string(s) starting at i and extending to or past looksize. As noted above, when i is outside of looksize (to the right of looksize as illustrated in FIG. 6), or more specifically, when looksize <i< looksize+maxmatch, comp(i) and raw(i) have a value of 0.

Next, at step 238, a determination is made as to whether or not a new string (i,j) should be selected. So long as i is greater than 1, no new string is selected and the LLH algorithm proceeds to step 240. At the latter step, the then current value of i is decremented by 1, and the LLH algorithm returns to step 232. By this decrementing, j, the length of the string (i,j), is increased by 1. If i is greater than 1, the LLH algorithm proceeds to step 242.

At step 242, the "top" (numerator) and "bottom" (denominator) for a fraction used in the next step are formed. The top value is calculated by adding psize, the length of the pointer for the string starting at position i that is j characters long, for the most recently selected string (i,j), to comp[i+j]. Comp[i+j] is the length of the compressed form of the remainder of the buffer, which was calculated during an earlier iteration, as described below. The summation of psize+comp[i+j] is equal to the compressed size of the portion of the buffer starting at position i and extending to looksize, or beyond looksize if the last string in the input stream extends across looksize into the remainder of the LLH buffer. The bottom value is calculated by multiplying j by csize for the most recently selected string (i,j) starting at position (i,j) and then adding raw[i+j] to the resulted product. Raw[i+j] is the number of raw characters required to represent the characters of the optimal parse taken at position [i+j].

Thereafter, the LLH algorithm proceeds to step 244 where top is divided by bottom and the resultant quotient is compared with comp[i] divided by raw[i+j] to determine whether or not top/bottom is less than comp[i]/raw[i+j]. Top/bottom represents the compression achieved for the most recently selected string (i,j). Comp[i]/raw[i+j] represents the best compression ratio achieved prior to position (i,j). If top/bottom is not less than comp[i]/raw[i+j], the LLH algorithm returns to step 238. If top/bottom is less than comp[i]/raw[i+j] then the algorithm proceeds to step 246.

At step 246, comp[i] is set equal to the most recently computed value for top and raw[i] is set equal to the most recently computed value for bottom. Thereafter, the LLH algorithm returns to step 238. As an example of how the LLH algorithm the input stream so as to achieve a better rate of compression than is achieved using a conventional greedy algorithm reference should be made to FIGS. 5 and 7. In FIG. 7, an input stream consisting of the characters abbbbab is provided. For the purpose of this example, dictionary 100 is assumed to contain only the initialized character set, which includes the characters a and b, and the strings ab and bbbb. This example assumes the present system uses 8-bit characters and 12-bit pointers. Choosing the string ab as the first current match gives a compression ratio of $12/2\times 8 = \frac{3}{4}$ for the first two characters. Alternatively, by parsing the input stream at a followed by bbbb gives a compression ratio 2*12/5*8=35 for the first 5 characters. As 3/5 is less than $\frac{3}{4}$, the LLH would choose the alternative parse, and select a as the current match, bbbb as the next match, and ab as the final match.

Only the pointer for the current match a will be output at step 234. The next match bbbb may or may not be output at step 234 as the next current match depending upon the results of the compression ratio calculation for the next string of input data characters. The next string will differ from the current string only in that the character a will be removed from the beginning of the string and a new character will be added to the end of the string. Identical compression ration calculations will be performed similarly on strings subsequently entered into the LLH buffer.

Other parsing and matching algorithms may also be satisfactorily employed in place of the greedy algorithm and the LLH. For instance, a parsing strategy may be employed that is based on looking for common delimiters that define actual boundaries between strings. For instance, for English language text, characters such as "", ".", and "," define boundaries between frequently-occurring strings. Such delimiting characters can be determined dynamically by determining the frequency counts (e.g., in English text, the "" character may occur ten times as frequently as the "," character) of characters.

Update Algorithm

Referring again to FIG. 4, at step 204 of the compression algorithm, a set of strings X is created using an update algorithm, as discussed briefly above. These strings are created using either a pure all-prefixes heuristic ("PAPH") or a modified all-prefixes heuristic ("MAPH"). The update algorithm is stored in read-only memory 24. As noted above, dictionary 100, in which these newly created strings are stored, is maintained in dynamic memory 22. Microprocessor 28 executes the various functions performed by the update algorithm using the data in dynamic memory 22.

With the PAPH, after a new current match t has been made, a set of strings X is generated by concatenating the last or previous match with each of the non-empty prefixes of current match t. The prefixes of string t are formed by adding sequentially to the first character in the string t the subsequently-appearing characters in the string t. For instance, if string t comprises the characters "THE", the prefixes of the string will be "T" "TH", and "THE". Thereafter, those strings in set X that are not in dictionary 100 are added to the dictionary.

A more detailed illustration of the manner in which set of strings X is generated by PAPH is set forth in FIG. 8. As used herein, the symbol "_" denotes a space. This example is based on a data input stream containing the string "THE CAT AT THE CAR ATE THE RAT". Also, for the purposes of this example, dictionary 100 is assumed to contain only the characters A-Z and _. At the first step of the example, no strings are added because the string "T" is already in dictionary 100 (as "T" is an element of the initial character set). At step two, current match "H" is concatenated with last or previous match "T" so as to generate string "TH", the latter comprising the sole string X in set of strings X. Additional new strings for set X are generated in a similar manner. Referring to lines 16 and 17 of the example, when the last match contains the characters "E_", and current match t contains the characters "THE_", the new set strings X will consist of the strings "E_T", "E_TH", "E_THE", and "E_THE_". The strings "THE" and "THE_" are not added to the dictionary 100, since by definition if "THE_" is the current match then "THE_" and its prefixes are already in the dictionary. Relatively high rates of compression are achieved using the PAPH as the update heuristic because new strings are systematically grown in a very rapid manner based on strings already present in dictionary 100.

Referring to FIGS. 3 and 8, the update algorithm may also comprise a variation of the PAPH, the modified all-prefixes heuristic ("MAPH"), for generating new strings of data. MAPH is similar to PAPH, except that MAPH also limits to a selected degree parameter q the number of descendants nodes 114 that may depend from a given descendant node 114. Thus, for any descendant node 114, only q descendant nodes 114 may depend therefrom. When a new string x is created in set of strings X that would constitute the q+1th descendant node depending from a given descendant node 114, that new string is not added to dictionary 100.

Preferably, q is equal to approximately 5 to 10 percent of the total size of array 110. Thus, if array 110 consists of 256 nodes 112, q will range from between 12 to 26.

As an example of how MAPH works, consider again the example of FIG. 8. If q=2, MAPH will generate new strings in the same manner as PAPH until line 11 is reached where TH is presented. At this point, two strings _C and _A, already depend from the _ node. As a result, because q=2, the new strings _T and _TH are not added to dictionary 100.

A significant advantage of the PAPH and the MAPH is realized when the input data stream contains a long sequence of repeated characters. For instance, if the input data stream contains a long string of blanks, strings of blanks are added to the dictionary 100 in rapid fashion. Specifically, if the first two current matches are one character long, the third match will be 2 characters long, the fourth match 3 characters long, the fifth match 5 characters, and so on, i.e. forming Fibonacci sequence. Thus, the match size almost doubles with each successive match, with the result that the string of blanks is transmitted in compressed form at high levels of compression over a short period of time.

The use of MAPH allows dictionary 100 to be represented in a structure that is more compact than a hashing data structure. Additionally, MAPH has a known worst case access time per node 112 that is related to the value of q selected. In addition to the foregoing, MAPH typically improves slightly the compression performance of the compression algorithm.

The update heuristic may also comprise a maxmatch algorithm for limiting the size of the prefixes which are generated by the concatenation of the last match and the current match. When a prefix is generated that is more than maxmatch characters long, the update heuristic will truncate the prefix so that the prefix does not exceed maxmatch characters in length. Maxmatch may satisfactorily range from 25 to some large percentage of the total number of strings 102 in dictionary 100. Preferably, maxmatch is equal to about 100.

Deletion Algorithm

Turning again to FIG. 4, at step 216 of the compression algorithm, one or more strings 102 is (are) deleted from dictionary 100 using a deletion algorithm ("DH"), as discussed briefly above. These strings are deleted using a least recently used queue heuristic ("LRUH") or a modified least recently used queue heuristic ("MLRUH").

The deletion algorithm is stored in read-only memory 24, and strings being deleted are located in dictionary 100 which is stored in dynamic memory 22. Microprocessor 28 executes the various functions performed by the deletion algorithm using the data in dynamic memory 22.

With the LRUH, strings 102 are stored in dictionary 100 in queue. Each time a string is referenced, the string is moved to the front of the queue. When the dictionary is full and the update heuristic has generated one or more new strings to be added to the dictionary, space is created for the new strings(s) by removing a corresponding number of the least recently used strings at the end of the queue. This use of least recently used heuristics in data compression methods is well known.

While the LRUH provides a satisfactory method of creating space in dictionary 100 for new strings, the LRUH tends to be relatively difficult to implement. This difficulty arises from the need to (1) delete only non-leaf nodes from the trie, if leaf and non-leaf nodes are kept in the queue, or (2) keep track of when the nodes change between leaf and non-leaf status, if only leaf nodes are kept in the queue. Referring to FIG. 3, a leaf node is the last descendant node 114 in a string 102 and a non-leaf node is any descendant other than the last descendant node 114 in a string. For instance, in the string DOG, G is a leaf node and O is a non-leaf node. To simplify implementation of LRUH, the modified least recently used heuristic ("MLRUH") was developed.

In the MLRUH, the strings newly created by the update heuristic are placed at the front of the queue in a special "reverse order" arrangement. More specifically, the strings are arranged so that the ancestors of any given descendant node 114 are positioned closer to the front of the queue than the given node. Thus, all of the prefixes of the last match/current match concatenation are placed in reverse order at the front of the queue, and all of the prefixes of the current match are placed directly behind the prefixes of the last match-/current match concatenation, except as noted below. As part of the MLRUH, the location of the front of the queue is stored for future reference in dynamic memory 22. This location is then used by the MLRUH in positioning new prefixes at or near the front, as described below.

Describing the MLRUH positioning scheme in greater detail, the prefixes of the last match/current match concatenation are positioned so that the shortest prefix of the concatenation is placed at the front of the queue, the next shortest prefix is placed one position back from the front of the queue, and so on, with the longest prefix, i.e., the entire concatenation, being placed farthest from the front of the queue with respect to the other concatenation prefixes. Similarly, the shortest prefix of the current match is placed toward the front of the queue and successively longer prefixes are placed behind the shortest prefix, with the current match prefix always being placed behind the last match-/current match concatenation prefixes, except as noted below.

The foregoing procedure is modified slightly, however, if the current match is already in the queue, but is not part of the initial character set and does not follow a last match that is part of the initial character set. In this case, the current match and its prefixed are placed at the front of the queue. If additional space is needed in the dictionary to position the newly added strings in the manner described above, a string is deleted from the end of the queue for each string added at or near the beginning of the queue.

As a part of the deletion algorithm, the initial character set entered into dictionary 100 as the first step of the compression algorithm is "frozen" in the dictionary. As such, the characters of this initial set are never deleted from the dictionary and do not participate in the LRUH or the MLRUH. Additionally, other characters or groups of characters may be similarly frozen in the dictionary. Typically, these other characters or groups of characters are ones that occur very frequently in the input data stream.

An example of the manner in which the contents of the queue are generated, positioned and deleted in dictionary 100 using the MLRUH is illustrated in FIG. 9. For purposes of illustration, the dictionary is assumed to have a size of 272 bytes, allowing it to comprise an initialized character set of 256 byte values and 16 new entries. New strings may be generated using either the PAPH or MAPH. The contents of the queue are generated from an input data stream comprising the phrase "THE CAT AT THE CAR ATE THE RAT". The example of FIG. 9 assumes strings enter the queue from the right and exit to the left.

In lines 1-8 of the example in FIG. 9, new strings of data are added to the queue using the MLRUH in the same manner in which strings are added to the LRUH, i.e., the last match is concatenated with the current match and the concatenation is added to the beginning of the queue. At line 9, however, the current match contains the first string that is not in the initialized set of 256 characters, the string AT. In accordance with procedure discussed above for the MLRUH, the last match/current match concatenation, _AT, and its prefixes, here only _A, are placed at the beginning of the queue, with the prefix being positioned before the concatenation. The current match, AT, is positioned near the front of the queue, but behind the concatenation and its prefix.

Next, at line 10, the last match/current match concatenation, AT_, is added before the last match, AT. At line 11, the last match/current match concatenation prefix, _T, is added to the beginning of the queue, the concatenation, _TH, is added next, and the current match, TH, is added after the concatenation.

At line 12, the full effect of the MLRUH is observable, as both the last match and current match are strings that are not part of the initial character set. Here, the last match/current match concatenation, THE_, and its prefix, THE, are added after the last match, with the prefix being positioned ahead of the concatenation. The prefix TH of the concatenation THE_ is not added to the queue because TH is already in the queue. The current match, _E, is moved to the front of the queue because _E is already in the queue.

At line 13, the current match, CA, is placed at the beginning of the queue because the string CA is already present in the queue and because CA is not an element of the initialized set and does not follow a last match that is an element of the initialized set. The last match-/current match concatenation, E_CA, and its prefix, E_C, are added before the last match E_.

At line 14, the last match/current match concatenation, CAR, is added before the last match, CA. R is not added to the beginning of the queue because R is an element of the initial character set. To make room for the new strings added to the dictionary, the string HE is deleted from the end of the queue. Such deletion is necessary because it has been assumed the dictionary will hold on 16 strings.

At line 15, the last match/current match concatenation, R_AT, and its prefixes, R_A and R_, are added to the beginning of the queue. These strings do not follow the last match, R, as the latter is not an added to the LRU queue because it comprises part of the initialized set. The current match, _AT, and its prefix, _A, are added after the last match current match concatenation. The current match, _AT, is not added to the beginning of the queue because the current match follows a last match that is an element in the initial character set. Because the dictionary only holds 16 strings, to make room for the new strings added to the dictionary the strings _C, T_, and AT_ are deleted from the end of the queue.

The manner in which the remaining input strings listed on lines 16–21 are arranged in the queue by the MLRUH, and the manner in which the strings are deleted from the queue, follows the procedure described above with respect to the input strings of lines 9–12.

The foregoing example illustrates the manner in which new strings are ordered in the LRU queue according to the MLRUH. In this example, the small dictionary size (16 entries) results in useful strings being deleted prematurely. With a dictionary of practical size, e.g. 4096 strings, useful strings are continually moved to the beginning of the queue. Infrequently used strings travel to the end of the queue as a result of this movement of frequently used strings to the front of the queue and are eliminated.

Data Decompression

Data compression module 20 may also be operated so as to decompress character data compressed by the same or another data compression module 20. Data compression module 20 decompresses data provided thereto from data device 50 using a data decompression algorithm stored in read-only memory 24. This data decompression algorithm operates in accordance with the various steps of the flow diagram illustrated in FIG. 10. As described hereinafter, the data decompression algorithm is identical to the data compression algorithm illustrated in FIG. 4, except that the matching step of the decompression algorithm varies from the corresponding matching step in the compression algorithm. Line by line coding of the decompression algorithm is considered to be well within the skill of an ordinary practitioner, and so is not provided herein.

As when data is compressed using data compression module 20, a code is transmitted at the beginning of the data stream of the data to be decompressed advising microprocessor 28 to implement the decompression algorithm stored in read-only memory 24. This code may take any form, so long as it is distinct from the code used to notify microprocessor 28 to implement the compression algorithm.

Figure 10:
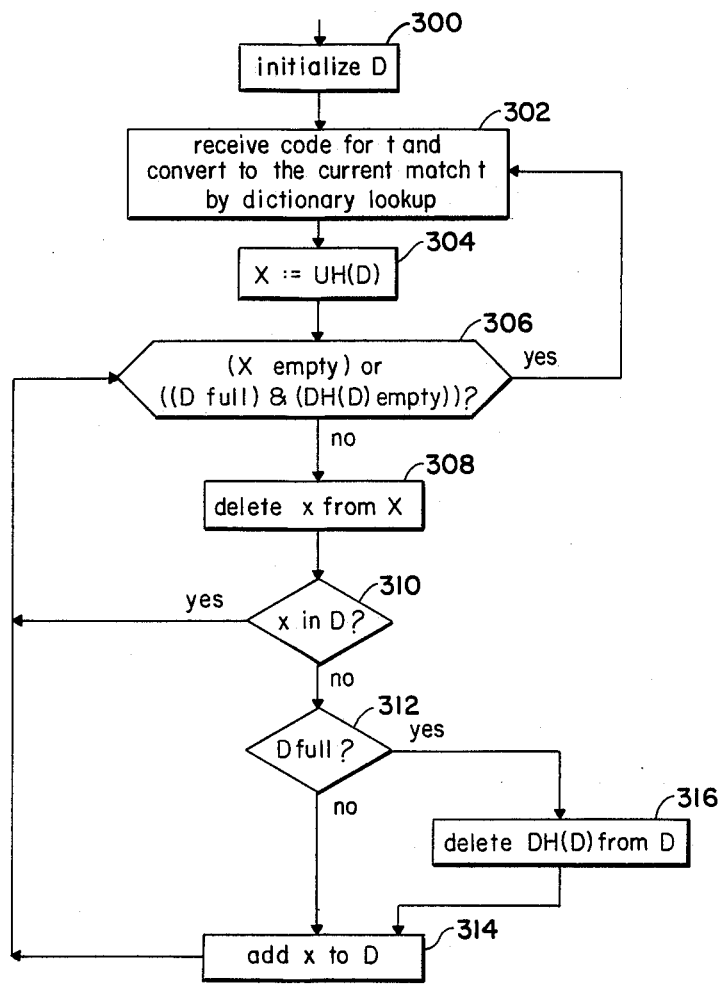
FIG. 10 is a flow diagram of the data decompression algorithm used by module 20.
Figure 11:
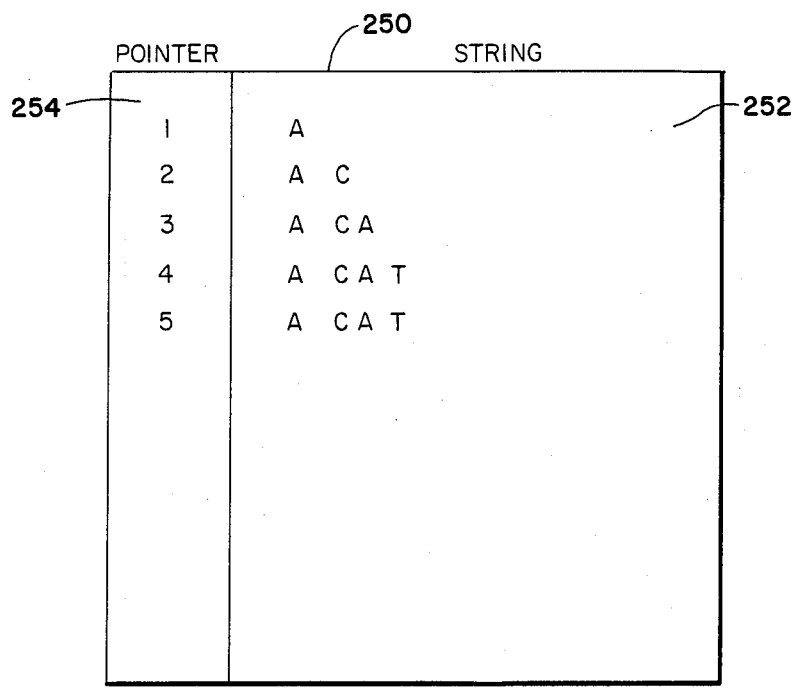
FIG. 11 is an example of the contents of dictionary 250.

Turning to FIGS. 1, 10 and 11, as the first step of the decompression algorithm, dictionary 250 is initialized with a character set of frequently-used characters or groups of characters. Dictionary 250 is identical to, but separate from, dictionary 100, and is maintained in dynamic memory 22. Dictionary 250 comprises a plurality of strings 252, each of which is identified by pointer 254. This first step, step 300, is identical to step 200 of the compression algorithm described above. As such, dictionary 250 contains the identical character set that was initialized in the dictionary 100 used in conjunction with the compression algorithm that was used to compress the data now being decompressed. In other words, if data is compressed in a first data compression module 20 and is decompressed in a second module 20, the dictionary 250 in the second module 20 is initialized at step 300 with the same character set that was initialized in the dictionary 100 of the first module 20 at step 200. As discussed above, and explained in greater detail below, dictionary 250 is continuously updated so as to contain the same strings that are maintained in the dictionary 100 used in the compression of the data to be decompressed. As with step 200, step 300 may be expanded to include a freeze step wherein selected characters are permanently stored in the decompression dictionary.

Next, at step 302, the pointer or code 254 identifying the current match t is received. This pointer 254 is then compared with the pointers in dictionary 250 until the corresponding pointer is found. The current match string t associated with the matched pointer is then output via serial I/O terminal 32 or 34.

Steps 304–316, inclusive, of the decompression algorithm are virtually identical to steps 204–216, inclusive, of the compression algorithm. As described below, however, steps 304–316 involve the use of dictionary 250 rather than the dictionary 100 used in steps 204–216.

At step 304, the update algorithm discussed above with respect to step 204 is employed for generating a new set of strings X. This new set of strings X is identical to the set of strings X previously generated at the corresponding iteration of the compression algorithm at step 204 thereof. Set of strings X is used to update dictionary 250 in the manner described above in relation to the description of the update algorithm, so as to ensure that for any selected iteration of the decompression algorithm, dictionary 250 always contains the same collection of strings contained in dictionary 100 at the corresponding iteration of the compression algorithm.

As with step 206, several questions are posed at step 306, the answers to which will determine the path the decompression algorithm follows. As discussed above, if the set of strings X is empty, or if dictionary 250 is full and the string positioned for deletion from dictionary 250 cannot be deleted from the dictionary, the decompression algorithm returns to step 302.

At step 308 a string x is removed from the set of strings X.

Next, a determination is made as to whether or not string x is in dictionary 250, as illustrated by step 310. If string x is found to be in dictionary 250, the decompression algorithm returns to step 306 and removes another string x from the set of strings X. If string x is not in dictionary 250, the decompression algorithm continues to step 312.

At step 312, a determination is made as to whether or not dictionary 250 is full. If dictionary 250 is not full, string x is added to the dictionary as a new string 252, as illustrated at step 314. If dictionary 250 is full, the decompression algorithm proceeds to step 316.

Thereafter, at step 316, the deletion algorithm described above in relation to step 216 of the compression algorithm is employed to delete the least recently used string 252 from dictionary 250 to provide space for string x to be added to the dictionary. Then, the decompression algorithm advances to step 314 where string x is added to the dictionary.

After string x has been added to dictionary 250, the decompression algorithm returns to step 306 and reads in a new string x from set of strings X. this iteration comprising steps 306–316, inclusive, continues until all strings x have been removed from the set of strings X, at which point set X is empty. As described above, when set X is empty, the decompression algorithm returns to step 302 where a new string is parsed from the input data stream and matched with a string 252 in dictionary 250.

The foregoing description of the decompression algorithm provides a brief overview of the manner in which data is decompressed by compression module 20. For a complete description of the subsidiary algorithms and heuristics employed in the decompression algorithm, attention is directed to the foregoing description of the update and deletion algorithms employed in the compression algorithm. As noted above, the subsidiary algorithms are used, without modification, in the decompression algorithm.

Dynamic Dictionary Size Selection

Depending upon the nature of the data in the input data stream, improved compression may be achieved in a dictionary having a greater or lesser number of strings, and hence longer or shorter pointers, respectively than in dictionary 100. For instance, if dictionary 100 has $2^{12}$ strings 102 and a second and identical dictionary has $2^{11}$ strings of data, with certain collections of input data, improved compression will be achieved with the second dictionary with its 11 bit pointers.

Figure 12:
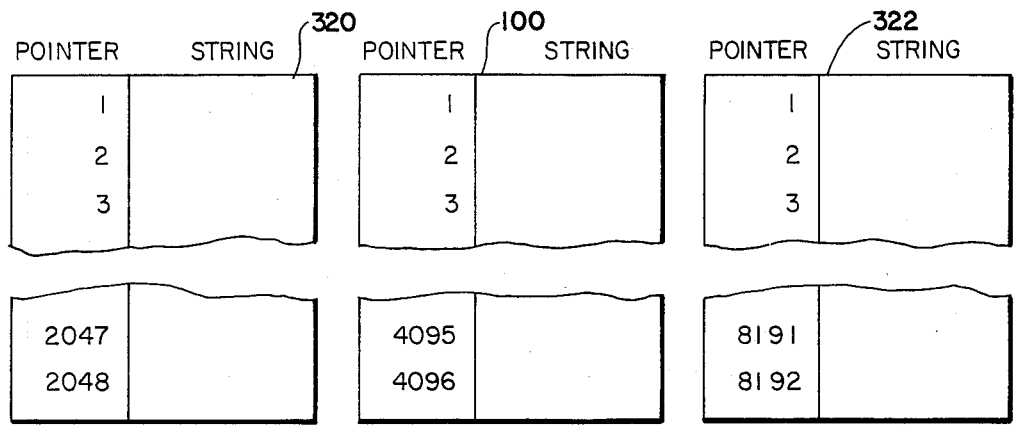
FIG. 12 shows an example of dynamic dictionary size selection.

Referring to FIG. 12, data compression module 20 may be adapted to include two additional dictionaries, dictionary 320 and 322, the former being half as large as dictionary 100 and the latter being twice as large as dictionary 100. Thus, for instance, if dictionary 100 has $2^{12}$ strings, of data, and hence 12 bit pointers, dictionary 320 will have $2^{11}$ strings of data and 11 bit pointers, and dictionary 322 will have $2^{13}$ strings of data and 13 bit pointers. Dictionaries 320 and 322 are operated in triple-harness with dictionary 100. The compression ratios achieved by dictionaries 100, 320 and 322 are periodically compared to one another to determine which dictionary is achieving the best compression ratios. If dictionary 320 is found to provide a higher rate of compression than is provided by dictionary 100, the size of dictionary 100 is halved. If, on the other hand, dictionary 322 is found to provide a higher rate of compression than is provided by dictionary 100, the size of dictionary 100 is doubled.

Figure 13:
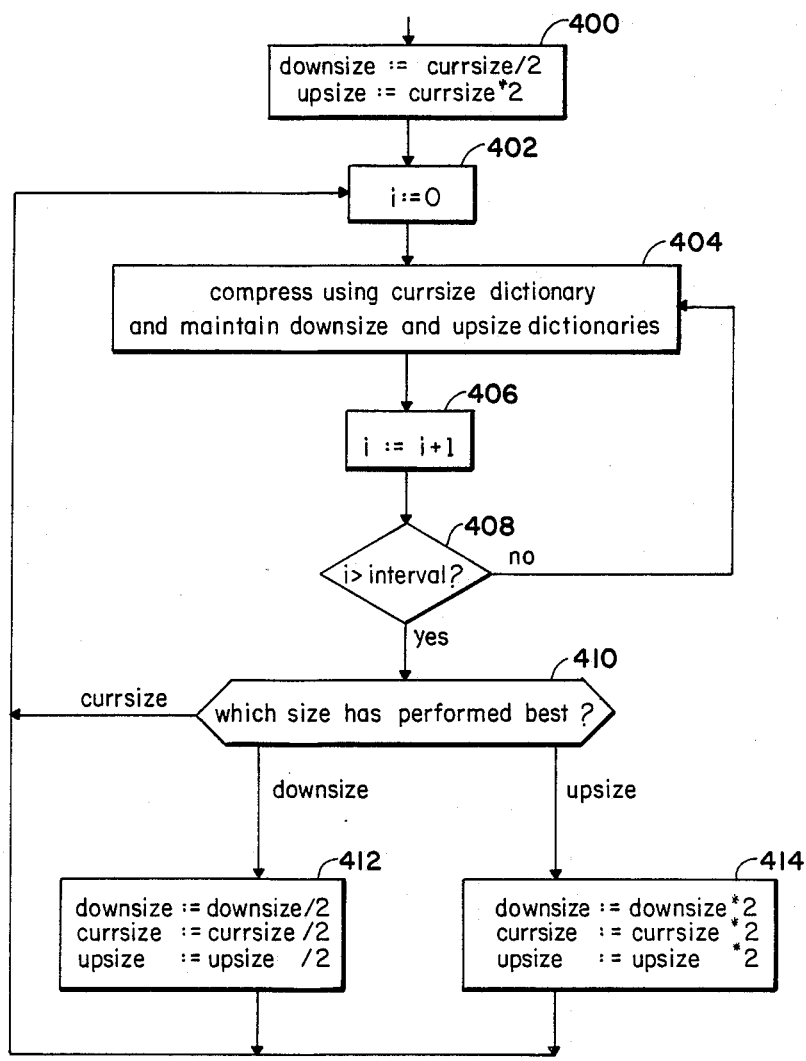
FIG. 13 is a flow diagram illustrating the implementation of the dynamic dictionary size selection procedure.

In FIG. 13, an algorithm is provided in flow diagram form illustrating how the foregoing dynamic dictionary size selection procedure is implemented using the hardware illustrated in FIG. 1. The dynamic dictionary size selection algorithm is stored in read-only memory 24. Dictionaries 320 and 322 are created in dynamic memory 22, and microprocessor 28 implements the algorithm using this information from read-only memory 24 and dynamic memory 22.

At step 400 of the dynamic dictionary size selection algorithm, the size of the downsize dictionary, dictionary 320, is set at half the size of the currsize dictionary, dictionary 100. Similarly, the size of the upsize dictionary, dictionary 322, is set at twice the size of the currsize dictionary.

Next, at step 402, i is initialized at 0. The variable i is used in controlling the iteration rate of the dictionary size selection algorithm as described below.

Figure 4:
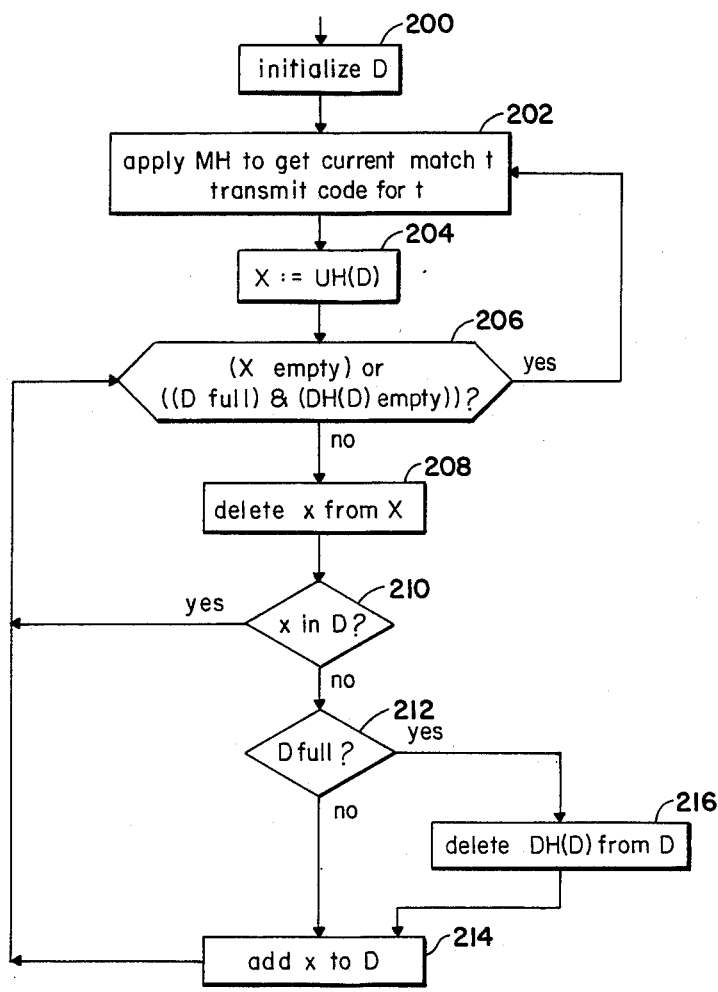
FIG. 4 is a flow diagram of the data compression algorithm used by data compression module 20.

At step 404, input character data is compressed using the compression algorithm illustrated in FIG. 4 and the currsize dictionary. At the same time, the input character data is compressed using the compression algorithm and the downsize and the upsize dictionaries.

Thereafter, at step 406, i is incremented by 1.

At step 408, i is compared to a preselected interval to determine if i is greater than the interval. The valve for the interval will depend upon the speed of the clock in microprocessor 28. For instance, if microprocessor 28 has 3.9 mHz clock, satisfactory compression is achieved when the interval ranges from 1 to 10 times the number of strings 102 in the currsize dictionary. If i is not greater than the interval, the algorithm returns to step 404. If i is greater than the interval, the algorithm continues on to step 410.

Next, at step 410, a comparison is made to determine which dictionary has achieved the best rate of compression. Compression rates are calculated by dividing the number of bits in the pointer that identifies the dictionary string that matches the current match by the number of bits required to represent the current match in uncompressed form. This calculation is performed continuously for all current matches appearing during interval i so as to provide a rate of compression for the input data stream arriving during interval i. If the currsize dictionary, dictionary 100, has achieved the best rate of compression, the algorithm returns to step 402. If the downsize dictionary, dictionary 320 has achieved the best rate of compression, the algorithm proceeds to step 412. At step 412, the respective sizes of the downsize, currsize and upsize dictionaries are decreased by one half. Thereafter the algorithm returns to step 402.

If the upsize dictionary is determined at step 410 to have achieved the best rate of compression, the algorithm proceeds to step 414. At step 414, the respective sizes of the downsize, currsize and upsize dictionaries are doubled. Thereafter the algorithm returns to step 402.

Successive iterations of the dynamic dictionary size selection algorithm are performed simultaneously as the compression algorithm compresses input data. Whenever the dynamic dictionary size selection algorithm is employed in conjunction with the compression algorithm, the dynamic dictionary size selection algorithm must also be employed in conjunction with the decompression algorithm when the latter is used for decompressing data compressed using the dynamic dictionary size selection algorithm.

While the present invention has been described as being implemented with discrete hardware and firmware elements, the present invention may also be satisfactorily implemented using a conventional microcomputer and suitable software The various algorithms stored in read-only memory 24 are incorporated in the software using known coding techniques. Alternatively, the present system may be implemented using a totally hardwired system, as is well known in the art.

Advantages Of The Present Invention

The present invention possesses several advantages over known data compression systems.

First, by updating the dictionaries of the system using the MAPH in conjunction with the MLRUH, significant improvements in performance, speed, memory requirements and ease of implementation are typically achieved as compared to known data compression systems, e.g., the systems Miller and Wegman.

Second, the present invention provides data compression with a system having relatively simple hardware and firmware structure. Additionally, the present system requires minimal memory.

Third, in special cases, a character set of very frequently appearing characters may be "frozen" in the read-only memory with the result that the dictionary of the system does not have to continuously relearn frequently-appearing strings of character data. In particular, unlike most previous systems (e.g. the systems of Lempel, Ziv, Seery and Welch), no uncompressed characters need be transmitted to ensure a match is made, as a match at least one character long will always be made with the present system.

Fourth, by maintaining three dictionaries of varying size and periodically comparing the rates of compression achieved by the dictionaries, and then reducing by one half or increasing by one half the size of the dictionary used in the data compression process based on the results of the comparison, the system of the present is adapted to compress a wide variety of textual data at high rates of compression.

Fifth, the use of a limited lookahead heuristic in place of a conventional greedy algorithm provides improvement in rates of compression.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. An apparatus for dynamically compressing and decompressing an input stream of data characters into a compressed stream code and for decompressing said compressed stream of code into uncompressed data characters, the apparatus comprising:

first dictionary means for storing a first plurality of strings of data characters, said first dictionary means comprising a plurality of unique codes each for identifying a corresponding respective one of said first plurality of strings, wherein said first plurality of strings comprises an initial set of unique data characters, with each character in said initial set being positioned in a corresponding respective one of said first plurality of strings;

second dictionary means for storing a second plurality of strings of data characters, said second dictionary means comprising a plurality of unique codes each for identifying a corresponding respective one of said second plurality of strings, wherein said second plurality of strings comprises an initial set of unique data characters that is identical to said initial set of unique data characters in said first plurality of strings, with each character in said initial set in said second plurality of strings being positioned in the one of said second plurality of strings that is identified by the same unique code as the string in said first plurality of strings in which the identical character from said initial set of characters in said first plurality of strings is positioned;

first match means for receiving and parsing said input stream of data characters into parsed strings of data characters and for comparing each of said parsed strings of data characters with said first plurality of strings so as to locate the one of said first plurality of strings that matches a corresponding one of said parsed strings, wherein the most recently matched one of said parsed strings is identified as the current match;

first transmitting means for transmitting the one of said plurality of unique codes identifying the one of said first plurality of stored strings that matches said current match, for each current match;

second match means for receiving said one unique code transmitted by said first transmitting means for each current match, and for comparing each said one unique code with said plurality of unique codes identifying said second plurality of strings so as to locate the one of said plurality of unique codes in said second dictionary means that matches said each said one unique code received from said first transmitting means;

second transmitting means for transmitting the string of character data in said second plurality of strings identified by the one of said plurality of unique codes in said second dictionary means that matches said one unique code received from said first transmitting means, for each string of character data matched by said second match means;

first update means for adding N new strings of data characters to said first dictionary means for each current match, wherein N equals the number of characters in said current match, said N new strings comprising the last current match concatenated with each non-empty prefix of said current match, and including means for assigning one of said plurality of unique codes to each of said new strings; and second update means for adding said N new strings of data characters to said second dictionary means for each current match, including means for assigning the same one of said plurality of unique codes to each of said N new strings added to said second dictionary means that is assigned to corresponding respective ones of said N new strings added to said first dictionary means.

2. An apparatus according to claim 1, further wherein said first match means parses said input data stream so that each of said parsed strings is the longest string possible that will match a corresponding one of said first plurality of stored strings.

3. An apparatus according to claim 1, further comprising:

input buffer means for storing a portion of said input data stream; and limited lookahead means for comparing said portion of said input data stream with said first plurality of strings stored in said first dictionary means so as to choose a parsing of said portion that, over time, allows said input data stream to be represented with substantially the fewest number of said plurality of unique codes possible, wherein a string from said portion chosen by said parsing of said portion is used as the current match.

4. An apparatus according to claim 3, further wherein:

said input buffer means comprises a looksize portion sized to hold from between 2 to 100 characters of input data and a maxmatch portion adjacent said looksize portion sized to hold from between 1 to 1000 characters of input data, wherein said maxmatch portion contains only character data forming part of a string of data that begins in the looksize portion and extends into the maxmatch portion; and said limited lookahead means comprises comparison means for:

(a) matching various strings of characters at least partially contained in said looksize portion with said first plurality of strings in said first dictionary means, and determining the number of bits required to represent each of said various strings of characters in compressed form by (1) determining the number of bits required to represent each of said plurality of unique codes identifying the ones of said first plurality of strings that match corresponding respective ones of said various strings of characters, and (2) determining the number of bits required to represent each of said various strings of characters in uncompressed form;
(b) calculating a compression ratio for each of said various strings of characters by dividing the number of bits required to represent said each of said various strings in compressed form by the number of bits required to represent said each of said various string in uncompressed form;
(c) comparing the compression ratios for each of said various strings of characters with others of said various strings so as to determine a parsing of said various strings that requires the fewest possible of said plurality of unique codes to represent said various strings in compressed form; and
(d) using one of said various strings of characters as said current match.

5. An apparatus according to claim 4, wherein said looksize portion holds about 8 characters and said max-match portion holds about 25 characters.

6. An apparatus according to claim 1,
wherein said strings in said first plurality of strings containing said characters of the initial set together define an array, and wherein said array comprises a plurality of unique root nodes and each of said unique root nodes contains a character from said initial set, and wherein each of said first plurality of strings depends from one of said plurality of unique root nodes, further wherein the number of said first plurality of strings that depend from a single root node is equal to about the number of characters in said initial character set; and
wherein said strings in said second plurality of strings containing said characters of the initial sot together define an array, and wherein said array comprises a plurality of unique root nodes and each of said unique root nodes contains a character from said initial set, and wherein each of said second plurality of strings depends from one of said plurality of unique root nodes, further wherein the number of said second plurality of strings that depend from a single root node is equal to about the number of characters in said initial set of characters.

7. An apparatus according to claim 6, wherein said arrays in said first and second dictionary means each comprise about 256 root nodes.

8. An apparatus according to claim 6, wherein each character in said first and second plurality of strings, except for the characters contained in the root nodes of said first and second plurality of strings, is positioned at a descendant node, further wherein the number of descendant nodes that are permitted to depend from any given descendant node is equal to about 5 to 10 percent of the total number of root nodes in said array.

9. An apparatus according to claim 8, only about 12 to 25 descendant nodes are permitted to depend from any given descendant node.

10. An apparatus according to claim 1, wherein said first and second update means each comprise deletion means for deleting strings of data from said first and second dictionary means, respectively, so as to provide room for said N new strings of data added to said first and second dictionary means.

11. An apparatus according to claim 10, wherein said first and second dictionary means are each initialized with a set of characters prior to the receipt by said first match means of the first string in said input stream, and further wherein said deletion means of said first and second dictionary means never delete said initialized set of characters from said first and second dictionary means, respectively.

12. An apparatus according to claim 10, wherein said first and second plurality of strings are arranged in said first and second dictionary means, respectively, in a least recently used queue by successively increasing frequency of use, with the least frequently used ones of said first and second plurality of strings being positioned at the end of the queue and the most frequently used ones of said first and second plurality of strings being positioned at the front of the queue.

13. An apparatus according to claim 10, wherein said first and second plurality of strings each comprise a selected number of strings and wherein each of said first and second plurality of strings is arranged in a modified least recently used queue that is organized so that:
(a) said last current match and current match prefix concatenations are positioned after said prefixes of said current match;
(b) said last current match and current match prefix concatenations are arranged by length, so that the shortest prefix appears before the next longest prefix, and successively longer prefixes appear thereafter, with the longest prefix being positioned after all shorter prefixes, and said current match prefixes are arranged by length, so that the shortest prefix appears before the next longest prefix, and successively longer prefixes appear thereafter, with the longest prefix being positioned after all shorter prefixes;
(c) said current match prefixes are positioned at the beginning of said queue, except when said current match follows one of said initial set of characters in which case said current match prefixes are positioned after said last match and current match prefix concatenations;
(d) said characters of the initial set are not included in said queue;
(e) if a prefix of a last match and current match concatenation or a prefix of a current match is already in said queue said prefix is deleted from said queue when said N new strings are added to said first and second dictionary means; and
(f) strings are deleted from the end of said queue to provide room for N new strings whenever the total number of strings in said first and second dictionary means exceeds said selected number.

14. An apparatus according to claim 10, wherein each character in said first and second plurality of strings, except for the characters contained in the root nodes of said first and second plurality of strings, is positioned at a descendant node, and wherein each of said plurality of strings is arranged in a modified least recently used queue that is organized so that the ancestors of any given descendant node positioned closer to the front of said modified least recently used queue than said given descendant node.

15. An apparatus according to claim 1, wherein each of said current matches is represented by data bits, and wherein each of said unique codes in said first and second dictionary means is represented by a selected number of data bits and said selected number is related to the number of strings in said first and second plurality of strings, said first and second plurality of strings each having an identical number of strings, further wherein said apparatus comprises:

means for computing the rate of data compression achieved by said apparatus by dividing, for each current match, the number of bits in said unique code identifying the one of said first plurality of strings that matches said each current match by the number of bits in said each current match;

first means for varying the number of strings in said first plurality of strings pursuant to said rate of data compression achieved by said apparatus so as to maximize said rate of data compression achieved by said apparatus; and second means for varying the number of strings in said second plurality of strings whenever said first means varies the number of strings in said first plurality of strings so that said first and second plurality of strings comprise identical numbers of strings.

16. An apparatus according to claim 1 further comprising means for increasing or decreasing the number of strings in said first and second plurality of strings so as to minimize the number of said unique codes required to represent a given number of input stream data characters.

17. An apparatus according to claim 1 further comprising:
- a first downsize dictionary that is identical to and performs the same functions as said first dictionary means, except that said first downsize dictionary contains half as many strings in its first plurality of strings as said first dictionary means;
- a first upsize dictionary that is identical to and performs the same functions as said first dictionary means, except that said first upsize dictionary contains twice as many strings in its first plurality of strings as said first dictionary means;
- a second downsize dictionary that is identical to and performs the same functions as said second dictionary means, except that said second downsize dictionary contains half as many strings in its second plurality of strings as said second dictionary means;
- a second upsize dictionary that is identical to and performs the same functions as said second dictionary means, except that said second upsize dictionary contains twice as many strings in its second plurality of strings as said second upsize dictionary means;

further wherein:
(a) said first match means additionally compares each of said parsed strings with the first plurality of strings stored in said first downsized dictionary and said first upsize dictionary so as to locate that one of said stored strings, for both said first downsize dictionary and said first upsize dictionary, that matches a corresponding one of said parsed strings, and wherein the most recently matched one of said parsed strings in said first downsized dictionary is identified as the downsized current match and wherein the most recently matched one of said parsed strings in said first upsize dictionary is identified as the upsize current match;
(b) said first transmitting means transmit the unique codes identifying the three ones of said first plurality of strings stored in said first dictionary means, said first downsize dictionary, and said first upsize dictionary that match, respectively, said current match, said downsize current match, and said upsize current match, wherein said unique codes identifying said three ones of said first plurality of strings stored in said first dictionary means, said first downsize dictionary, and said first upsize dictionary are together identified as the match code;
(c) said second match means compares, respectively, said three ones of said strings in said match code with said unique codes identifying said second plurality of strings in said second dictionary means, said second downsize dictionary, and said second upsize dictionary, so as to locate, respectively, the three ones of said unique codes in said second dictionary means, said second downsize dictionary, and said second upsize dictionary that match, respectively, said three ones of said first plurality of strings in said match code received from said first transmitting means;
(d) said second transmitting means transmits the strips of character data identified by said three ones of said unique code in said second dictionary means, said second downsize dictionary, and said second upsize dictionary, that match, respectively, said three ones of said first plurality of strings in said match code;
(e) said first update means additionally adds said N new strings of data to said first downsize dictionary, and said first upsize dictionary;
(f) said second update means additionally adds said N new strings of data to said second downsize dictionary and said second upsize dictionary;

said apparatus additionally comprising:

dictionary comparison means for comparing the number of characters in said current match, said downsize current match, and said upsize current match, with, respectively, (a) the number of characters in the unique code identifying the one of said first plurality of strings in said first dictionary means that matches said current match, (b) the number of characters in the unique code identifying the one of said first plurality of strings in said first downsize dictionary that matches said downsize current match, and (c) the number of characters in the unique code identifying the one of said first plurality of strings in said first upsize dictionary that matches said upsize current match, so as to determine the rates of data compression achieved using, respectively, said first dictionary means, said first downsize dictionary, and said first upsize dictionary;

means for reducing the number of strings in said first plurality of strings in said first dictionary means by one half if a higher rate of data compression is achieved using said first downsize dictionary than is achieved using said first dictionary means;

means for doubling the number of strings in said first plurality of strings in said first dictionary means if a higher rate of compression is achieved using said first upsize dictionary than is achieved using said first dictionary means;

means for changing the number of strings in said second dictionary means whenever said means for reducing or said means for doubling changes the number of strings in said first plurality of strings in said first dictionary means, so that said second dictionary means contains the same number of strings in its second plurality of strings as said first dictionary means.

18. An apparatus for dynamically compressing an input stream of data characters into a stream of compressed code, and for dynamically decompressing said stream of compressed code into said input stream of data characters, the apparatus comprising:
- encoder module means for encoding said stream of characters and for transmitting said stream of characters in encoded form;
- decoder module means for decoding said encoded stream of characters and for transmitting said stream of characters in uncoded form;
- wherein said encoder module means and said decoder module means each comprise:
- dictionary means for storing a plurality of strings of said characters, wherein each of said plurality of strings has a unique address;
- first match means (1) for receiving said input stream of data characters, (2) for matching strings of characters from said input stream of characters with ones of said plurality of strings of characters in said dictionary means in said encoder module, and (3) for transmitting the address of matched ones of said plurality of strings;
- second match means for (1) receiving the addresses of strings with which matches have been made, (2) matching said each of said addresses with the addresses of said plurality of strings in said dictionary means in said decoder module, and (3) transmitting the characters in those of said plurality of strings having addresses that match said addresses received by said second match means;
- update means for updating said dictionary means in said encoder module and said decoder module so that said plurality of strings stored therein contain strings of characters frequently present in said stream of characters, and for concatenating the last matched string with the currently matched string; and
- deletion means for deleting from said plurality of strings of characters in said dictionary means in said encoder module and in said dictionary means in said decoder module those strings with which strings of characters from said input stream are approximately least frequently matched by arranging said plurality of strings in said dictionary means in said encoder and decoder modules in a reverse order arrangement with the currently matched strings appearing after said concatenation of the last matched string and the currently matched string.

19. An apparatus for dynamically compressing an input stream of data characters into a compressed stream of code, the system comprising:
- dictionary means for storing a plurality of strings of data characters, said dictionary means comprising a plurality of unique codes each for identifying a corresponding respective one of said plurality of strings, wherein said plurality of strings comprises an initial set of unique data characters, with each character in said initial set being positioned in a corresponding respective one of said plurality of strings;
- match means for receiving and parsing said input stream of data characters into parsed strings and for comparing each of said parsed strings of data characters with said plurality of strings in said dictionary means so as to locate the one of said stored plurality of strings that matches a corresponding one of said parsed strings, wherein the most recently matched one on said parsed strings is identified as the current match;
- transmitting means for transmitting said unique code identifying the one of said plurality of stored strings that matches said current match; and
- update means for adding N new strings of data characters to said dictionary means, wherein N equals the number of characters current match concatenated with each non-empty prefix of said current match, and including means for assigning one of said plurality of unique address codes to each of said N new strings.

20. An apparatus according to claim 19, further wherein said match means parses said input data stream so that each of said parsed strings is the longest string possible that will match a corresponding one of said plurality of stored strings.

21. An apparatus according to claim 19, further comprising:
- input buffer means for storing a portion of said input data stream; and
- limited lookahead means for comparing said portion of said input data stream with said plurality of strings stored in said dictionary means so as to choose a parsing of said portion that, over time, allows said input data stream to be represented with substantially the fewest number of said plurality of unique codes possible, wherein a string from said portion closed by said parsing of said portion is used as the current match.

22. An apparatus according to claim 21, further wherein:
- said input buffer means comprises a looksize portion sized to hold from between 2 to 100 characters of input data and a maxmatch portion adjacent said looksize portion sized to hold from between 1 to 1000 characters of input data, wherein said maxmatch portion contains only character data forming part of a string of data that begins in the looksize portion and extends into the maxmatch portion; and
- said limited lookahead means comprises comparison means for:
  - (a) matching various strings of characters at least partially contained in said looksize portion with said plurality of stored strings in said dictionary means, and determining the number of bits required to represent each of the various strings of characters in compressed form by (1) determining the number of bits required to represent each of the plurality of unique codes associated with the ones of said plurality of stored strings that match corresponding respective ones of said various strings of characters, and (2) determining the number of bits required to represent each of said various strings of characters in uncompressed form;
  - (b) calculating a compression ratio for each of said various strings of characters by dividing the number of bits required to represent said each of said various strings in compressed form by the number of bits required to represent said each of said various string in uncompressed form;
  - (c) comparing the compression ratios for each of said various strings of characters with others of said various strings so as to determine a parsing of said various strings that requires the fewest possible of said plurality of unique codes to represent said various strings in compressed form; and (d) using one of said various strings of characters as said current match.

23. An apparatus according to claim 22, wherein said looksize portion holds about 8 characters and said maxmatch portion holds about 25 characters.

24. An apparatus according to claim 19, wherein said strings in said plurality of strings containing said characters of the initial set in said dictionary means together define an array, and wherein said array comprises a plurality of unique root nodes and each of said unique root nodes contains a character from said initial set, and wherein each of said plurality of strings depends from one of said plurality of unique root nodes, further wherein the number of said plurality of strings that depend from a single root node is equal to about the number of characters in said initial character set.

25. An apparatus according to claim 24, wherein said array in said dictionary means comprises about 256 root nodes.

26. An apparatus according to claim 24, wherein each character in said plurality of strings in said dictionary means, except for the characters contained in the root node of said plurality of strings, is positioned at a descendant node, further wherein the number of descendant nodes that are permitted to depend from any given descendant node is equal to about 5 to 10 percent of the total number of root nodes in said array.

27. An apparatus according to claim 26, wherein only about 12 to 25 descendant nodes are permitted to depend from any given descendant node.

28. An apparatus according to claim 19, wherein said update means comprises deletion means for deleting strings of data from said dictionary means so as to provide room for said N new strings of data added to said dictionary means.

29. An apparatus according to claim 28, wherein said dictionary means is initialized with a set of characters prior to the receipt by said match means of the first string in said input stream, and further wherein said deletion means never deletes said initialized set of characters from said dictionary means.

30. An apparatus according to claim 28, wherein said plurality of strings in said dictionary means are arranged in a least recently used queue, with said plurality of strings being arranged in the queue by successively increasing frequency of use, with the least frequently used one of said plurality of strings being positioned at the end of the queue and the most frequently used one of said plurality of strings being positioned at the front of the queue.

31. An apparatus according to claim 28, wherein said plurality of strings in said dictionary means comprises a selected number of strings and wherein said plurality of strings is arranged in a modified least recently used queue that is organized so that;

(a) said last current match and current match prefix concatenations are positioned after said prefixes of said current match;

(b) said last current match and current match prefix concatenations are arranged by length, so that the shortest prefix appears before the next longest prefix, and successively longer prefixes appear thereafter, with the longest prefix being positioned after all shorter prefixes, and said current match prefixes are arranged by length, so that the shortest prefix appears before the next longest prefix, and successively longer prefixes appear thereafter, with the longest prefix being positioned after all shorter prefixes;

(c) said current match prefixes are positioned at the beginning of said queue, except when said current match follows one of said initial set of characters in which case said current match prefixes are positioned after said last current match and current match prefix concatenations;

(d) said characters of the initial set are not included in said queue;

(e) if a prefix of a last current match and current match concatenation or a prefix of a current match is already in said queue said prefix is deleted from said queue when said N new strings are added to said dictionary means; and (f) strings are deleted from the end of said queue to provide room for N new strings whenever the total number of strings in said dictionary means exceeds said selected number.

32. An apparatus according to claim 28, wherein each character in said plurality of strings in said dictionary means is positioned at a descendant node, and wherein each of said plurality of strings is arranged in a modified least recently used queue that is organized so that the ancestors of any given descendant node are positioned closer to the front of said modified least recently used queue than said given descendant node.

33. An apparatus according to claim 19, wherein each of said current matches is represented by data bits, and wherein each of said unique codes in said dictionary means is represented by a selected number of data bits and said selected number is related to the number of strings in said plurality of strings in said dictionary means, further wherein said apparatus comprises:

means for computing the rate of data compression achieved by said apparatus by dividing, for each current match, the number of bits in said unique code identifying the one of said plurality of strings in said dictionary means that matches said each current match by the number of bits in said each current match;

means for varying the number of strings in said plurality of strings in said dictionary means pursuant to said rates of data compression achieved by the apparatus so as to maximize the rates of data compression achieved by the apparatus 34. An apparatus according to claim 19, further comprising means for increasing or decreasing the number of said plurality of strings in said dictionary means so as to minimize the number of said unique codes required to represent a given number of input stream data characters.

35. A system for dynamically decompressing a compressed stream of code into uncompressed data characters, the system comprising:

dictionary means for storing a plurality of strings of data characters, said dictionary means comprising a plurality of unique codes for identifying a corresponding respective one of said plurality of strings, wherein said plurality of strings comprises an initial set of unique data characters, with each character in said initial set being positioned in a corresponding respective one of said plurality of strings;

match means for receiving said compressed stream code, and for comparing said stream of code with said plurality of unique codes identifying said plurality of strings in said dictionary means so as to locate the ones of said plurality of unique codes in said dictionary means that match corresponding ones of code in said stream of code received by said match means, wherein the most recently matched one of said plurality of unique codes in said dictionary means is identified as the current match;

transmitting means for transmitting the strings of character data identified by the ones of said plurality of unique codes in said dictionary that match said corresponding ones of said stream of code received by said match means; and update means for adding N new strings of data characters to said dictionary means for each string of characters transmitted by said transmitting means, wherein N equals the number of characters in a current match, said N new strings comprising the last current match concatenated with each nonempty prefix of said current match, and including means for assigning a unique address code to each of said new strings.

36. An apparatus according to claim 35, wherein said update means comprises deletion means for deleting strings of data from said dictionary means so as to provide room for said N new strings of data added to said dictionary means.

37. An apparatus according to claim 36, wherein said dictionary means is initialized with a set of characters prior to the receipt by said match means of the first string in said compressed stream of code, and further wherein said deletion means never deletes said initialized set of characters from said dictionary means.

38. An apparatus according to claim 35, wherein said plurality of strings in said dictionary means are arranged in a least recently used queue, with the strings being arranged in the queue by successively increasing frequency of use, with the least frequently used strings being positioned at the end of the queue and the most frequently used strings being positioned at the front of the queue.

39. An apparatus according to claim 35, wherein said plurality of strings in said dictionary means comprises a selected number of strings and wherein said plurality of strings is arranged in a modified least recently used queue that is organized so that:

(a) said last current match and current match prefix concatenations are positioned after said prefixes of said current match;

(b) said last current match and current match prefix concatenations are arranged by length, so that the shortest prefix appears before the next longest prefix, and successively longer prefixes appear thereafter, with the longest prefix being positioned after all shorter prefixes, and said current match prefixes are arranged by length, so that the shortest prefix appears before the next longest prefix, and successively longer prefixes appear thereafter, with the longest prefix being positioned after all shorter prefixes;

(c) said current match prefixes are positioned at the beginning of said queue, except when said current match follows one of said initial set of characterizing which case said current match prefixes are positioned after said last match and current match prefix concatenations;

(d) said characters of the initial set are not included in said queue;

(e) if a prefix of a last match and current match concatenation or a prefix of a current match is already in said queue said prefix is deleted from said queue when said N new strings are added to said dictionary means; and (f) strings are deleted from the end of said queue to provide room for N new strings whenever the total number of strings in said dictionary means exceeds said selected number.

40. An apparatus according to claim 35, wherein each character in said plurality of strings in said dictionary means is positioned at a descendant node, and wherein each of said plurality of strings is arranged in a modified least recently used queue that is organized so that the ancestors of any given descendant node are positioned closer to the front of said modified least recently used queue than said given descendant node.

41. An apparatus according to claim 35, wherein each of said current matches is represented by data bits, and wherein each of said plurality unique codes in said dictionary means is represented by a selected number of data bits and said selected number is related to the number of strings in said plurality of strings in said dictionary means, further wherein said apparatus comprises:

means for computing the rate of data compression achieved by said apparatus by dividing, for each current match, the number of bits in said unique code identifying the one of said plurality of strings in said dictionary means that matches said each current match by the number of bits in said each current match;

means for varying the number of strings in said plurality of strings in said dictionary means pursuant to said rates of data compression achieved by the apparatus so as to maximize the rates of data compression achieved by the apparatus.

42. An apparatus according to claim 35, further comprising means for increasing or decreasing the number of said plurality of strings in said dictionary means so as to minimize the number of said unique codes required to represent a given number of input stream data characters.

43. An apparatus according to claim 1, further comprising bypass means for passing said input stream of data characters through said apparatus so that said data is neither compressed or decompressed.

44. An apparatus according to claim 19, further comprising bypass means for passing said input stream of data characters through said apparatus so that said data is neither compressed or decompressed.

45. An apparatus according to claim 35, further comprising bypass means for passing said input stream of data characters through said apparatus so that said data is neither compressed or decompressed.

46. An apparatus according to claim 1, wherein said deletion means of said first and second dictionary means each comprise means for selecting a special set of characters, wherein characters in said special set of characters are never deleted from said first and second dictionary means.

47. An apparatus according to claim 1, said first update means and said second update means each comprising maxmatch means for limiting the length of each of said N new strings of data characters to maxmatch characters long, wherein maxmatch ranges from 1 to the number of strings in said plurality of strings in said first and second dictionary means.

48. An apparatus according to claim 47, wherein maxmatch ranges from 10 to 100.

49. An apparatus according to claim 19, said update means further comprising maxmatch means for limiting the length of each of said N new strings of data to maxmatch characters long, wherein maxmatch ranges from 1 to the number of strings in said plurality of strings in said first and second dictionary means.

50. An apparatus according to claim 49, wherein maxmatch ranges from 10 to 100.

51. An apparatus according to claim 35, said update means further comprising maxmatch means for limiting the length of each of said N new strings of data to maxmatch characters long, wherein maxmatch ranges from 1 to the number of strings in said plurality of strings in said first and second dictionary means.

52. An apparatus according to claim 51, wherein maxmatch ranges from 10 to 100.

53. An apparatus according to claim 1 wherein said apparatus is designated to operate in either a compression mode or a decompression mode, further wherein said apparatus comprises means for switching said apparatus (a) to said compression mode upon receipt of a first signal in said input stream of data characters and (b) to said decompression mode upon receipt of a second signal in said input stream.

54. An apparatus according to claim 18 wherein said apparatus is designated to operate in either a compression mode or a decompression mode, further wherein said apparatus comprises means for switching said apparatus (a) to said compression mode upon receipt of a first signal in said input stream of data characters and (b) to said decompression mode upon receipt of a second signal in said input stream.

55. An apparatus for dynamically compressing and decompressing an input stream of data characters into a compressed stream of code and for decompressing said compressed stream of code into uncompressed data characters, the apparatus comprising:

first dictionary means for storing a first plurality of strings of data characters, said first dictionary means comprising a plurality of unique codes each for identifying a corresponding respective one of said first plurality of strings;

second dictionary means for storing a second plurality of strings of data characters, said second dictionary means comprising a plurality of unique codes each for identifying a corresponding respective one of said second plurality of strings;

first match means for receiving and parsing said input stream of data characters into parsed strings of data characters and for comparing each of said parsed strings of data characters with said first plurality of strings so as to locate the one of said first plurality of strings that matches a corresponding one of said parsed strings, wherein the most recently matched one of said parsed strings is identified as the current match;

first transmitting means for transmitting the one of said plurality of unique codes identifying the one of said first plurality of stored strings that matches said current match, for each current match;

second match means for receiving said one unique code transmitted by said first transmitting means for each current match, and for comparing each said one unique code with said plurality of unique codes identifying said second plurality of strings as to locate the one of said plurality of unique codes in said second dictionary means that matches said each one unique code received from said first transmitting means;

second transmitting means for transmitting the string of character data in said second plurality of strings identified by the one of said plurality of unique codes in said second dictionary means that matches said one unique code received from said first transmitting means, for each string of character data matched by said second match means;

first update means for adding N new strings of data characters to said first dictionary means for each current match, wherein N equals the number of characters in said current match, said N new strings comprising the last current match concentrated with each non-empty prefix of said current match, and including means for assigning one of said plurality of unique codes to each of said new strings; and second update means for adding said N new strings of data characters to said second dictionary means for each current match, including means for assigning the same one of said plurality of unique codes to each of said N new strings added to aid second dictionary means that is assigned to corresponding respective ones of said N new strings added to said first dictionary means.

* * * * *

UNITED STATES PATENT AND TRADEMARK OFFICE
CERTIFICATE OF CORRECTION

PATENT NO. : 4,876,541
DATED : 10/24/89
INVENTOR(S) : James A. Storer

It is certified that error appears in the above-identified patent and that said Letters Patent is hereby corrected as shown below:

IN THE TITLE: and col. 1 line 3 and 4.

Delete "STEM" and insert therefor -- SYSTEM --.

Claim 1, column 23, line 21, after "stream" insert -- of --;

Claim 4, column 25, line 9, delete "string" and substitute therefor -- strings --;

Claim 6, column 25, line 35, delete "sot" and substitute therefor -- set --;

Claim 9, column 25, line 56, after "8," insert -- wherein --;

Claim 14, column 26, line 57, after "node" insert -- are --;

Claim 17, column 27, line 50, delete "downsized" and substitute therefor -- downsize --;

Claim 17, column 27, line 52, delete "that" and substitute therefor -- the --;

Claim 17, column 27, line 57, delete "downsized" and substitute therefor -- downsize --;

Claim 17, column 27, line 58, delete "downsized" and substitute therefor -- downsize --;

Claim 17, column 27, line 62, delete " transmit" and substitute therefor -- transmits --;

UNITED STATES PATENT AND TRADEMARK OFFICE
CERTIFICATE OF CORRECTION

PATENT NO. : 4,876,541

DATED : 10/24/89

INVENTOR(S) : James A. Storer

It is certified that error appears in the above-identified patent and that said Letters Patent is hereby corrected as shown below:

Claim 17, column 28, line 19, delete "strips" and substitute therefor -- strings --;

Claim 19, column 29, line 68, delete "stored";

Claim 19, column 30, line 2, delete "on" and substitute therefor -- of --;

Claim 19, column 30, line 9, after "characters" insert -- in said --;

Claim 19, column 30, line 9, after "match" insert -- , said N new strings comprising the last current match --;

Claim 21, column 30, line 30, delete "closed" and substitute therefor -- chosen --;

Claim 22, column 30, line 64, delete "string" and substitute therefor -- strings --;

Claim 33, column 32, line 49, after "apparatus" insert -- . --;

Claim 35, column 32, line 68, before "code" insert -- of --;

Claim 39, column 33, lines 63 and 64, delete "characterizing" and substitute therefor -- characters in --;

Claim 41, column 34, line 20, after "plurality" insert -- of --;

Claim 43, column 34, line 47, delete "or" and substitute therefor -- nor --;

UNITED STATES PATENT AND TRADEMARK OFFICE
CERTIFICATE OF CORRECTION

PATENT NO. : 4,876,541
DATED : 10/24/89
INVENTOR(S) : James A. Storer

It is certified that error appears in the above-identified patent and that said Letters Patent is hereby corrected as shown below:

Claim 44, column 34, line 51, delete "or" and substitute therefor -- nor --;

Claim 45, column 34, line 55, delete "or" and substitute therefor -- nor --;

Claim 55, column 36, line 20, after "strings" insert -- so --;

Claim 55, column 36, line 23, after "each" insert -- said --;

Claim 55, column 36, lines 36 and 37, delete "concentrated" and substitute therefor -- concatenated --.

IN THE DRAWINGS:

In the heading of Fig. 9, delete "LRU QUEUE" and substitute therefor -- MLRU QUEUE --.

Signed and Sealed this

Eighteenth Day of February, 1992

Attest:

HARRY F. MANBECK, JR.

Attesting Officer    Commissioner of Patents and Trademarks